(12) United States Patent
Park et al.

(10) Patent No.: US 12,002,844 B2
(45) Date of Patent: Jun. 4, 2024

(54) DISPLAY DEVICE

(71) Applicant: Samsung Display Co., LTD., Yongin-si (KR)

(72) Inventors: Chul Won Park, Hwaseong-si (KR); Koichi Sugitani, Suwon-si (KR); Gwui Hyun Park, Hwaseong-si (KR); Sae Hee Han, Seoul (KR); Pil Soon Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 457 days.

(21) Appl. No.: 17/474,602

(22) Filed: Sep. 14, 2021

(65) Prior Publication Data

US 2022/0173156 A1 Jun. 2, 2022

(30) Foreign Application Priority Data

Dec. 1, 2020 (KR) .................. 10-2020-0165781

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/24* (2013.01); *H01L 33/38* (2013.01); *H01L 33/44* (2013.01)

(58) Field of Classification Search
CPC ....... H01L 33/005; H01L 33/24; H01L 33/38; H01L 33/44; H01L 33/16; H01L 33/62;
(Continued)

(56) References Cited

U.S. PATENT DOCUMENTS 11,094,867 B2 8/2021 Kang
2017/0336690 A1 11/2017 Lee et al.
(Continued)

FOREIGN PATENT DOCUMENTS

| EP | 3 657 542 | 5/2020 |
|---|---|---|
| KR | 10-1496151 | 2/2015 |
| KR | 10-2020-0015871 | 2/2020 |

OTHER PUBLICATIONS

Extended European Search Report for European Patent Application or Patent No. 21211798.0 dated Apr. 29, 2022.

*Primary Examiner* — Mohammad A Rahman
(74) *Attorney, Agent, or Firm* — KILE PARK REED & HOUTTEMAN PLLC

(57) ABSTRACT

A display device includes a first via layer on a substrate and including trench parts recessed from an upper surface of the first via layer, a first electrode and a second electrode on the first via layer and spaced apart from each other, a second via layer on the first via layer and including first openings partially exposing the first electrode, and a second opening partially exposing the second electrode, light emitting elements in the first openings of the second via layer and extending in a direction, and a third electrode on the second via layer. Each of the light emitting elements includes a first end electrically connected to the first electrode and a second end electrically connected to the third electrode such that the extending direction of the light emitting elements is not parallel to an upper surface of the substrate.

20 Claims, 26 Drawing Sheets

(51) Int. Cl.
 *H01L 33/24* (2010.01)
 *H01L 33/38* (2010.01)
 *H01L 33/44* (2010.01)

(58) Field of Classification Search
 CPC ............... H01L 25/0753; H01L 25/167; H01L 27/1214; H01L 33/00–648; H01L 27/15–156; H01L 2933/00–0091; H01L 33/483–486; H01L 2933/0033; H01L 2933/0025; H01L 33/50–508; H01L 2933/0041; H01L 33/52–56; H01L 2933/005; H01L 33/54; H01L 33/58–60; H01L 2933/0058; H01L 33/64–648; H01L 2933/0075; H01L 2933/0083; H01L 33/22; H01L 33/20; H01L 51/5262; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00
 See application file for complete search history.

(56) References Cited

U.S. PATENT DOCUMENTS

2017/0358503 A1  12/2017  Liu et al.
2019/0189706 A1*  6/2019  Choi ...................... H10K 59/88

\* cited by examiner

PX: PXA, PXB
PXn: PX1, PX2, PX3, PX4, PX5, PX6

DISPLAY DEVICE

CROSS-REFERENCE TO RELATED APPLICATION(S)

This application claims priority to and benefits of Korean Patent Application No. 10-2020-0165781 under 35 U.S.C. § 119 filed on Dec. 1, 2020 in the Korean Intellectual Property Office, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being developed.

A display device may include a display panel such as an organic light emitting display panel or a liquid crystal display panel as a device for displaying an image of the display device. Among them, as a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device with improved luminous efficiency.

It should be noted that objects of the disclosure are not limited to the above-mentioned objects, and other objects of the disclosure will be apparent to those skilled in the art from the following descriptions.

According to an embodiment a display device may include a first via layer disposed on a substrate and comprising trench parts recessed from an upper surface of the first via layer; a first electrode and a second electrode that are disposed on the first via layer and spaced apart from each other; a second via layer disposed on the first via layer and comprising first openings partially exposing the first electrode; and a second opening partially exposing the second electrode; light emitting elements disposed in the first openings of the second via layer and extending in a direction; and a third electrode disposed on the second via layer, wherein each of the light emitting elements may include a first end electrically connected to the first electrode; and a second end electrically connected to the third electrode; each of the light emitting elements may be disposed such that the extending direction of the light emitting elements is not parallel to an upper surface of the substrate.

An angle formed by the extending direction of the light emitting elements and a direction perpendicular to the upper surface of the substrate may be in a range of about 0 degrees to about 60 degrees.

The first openings may overlap the trench parts in a thickness direction.

A diameter of each of the first openings may be reduced from an upper surface of the second via layer toward a bottom surface of the second via layer, and a maximum diameter of each of the first openings may be smaller than a maximum diameter of the second opening of the second via layer.

A part of inner walls of each of the first openings may directly contact a part of an outer surface of a light emitting element, and the second via layer may surround a part of each of the light emitting elements.

The display device may further comprise a conductive layer disposed between the first via layer and the substrate, wherein the first via layer may further comprise contact holes penetrating the first via layer and partially exposing the conductive layer, and a first depth of each of the trench parts may be smaller than a second depth of each of the contact holes.

Each of the first depth of each of the trench parts and a thickness of the second via layer may be smaller than a length of each light emitting element in the extending direction, and the first ends of the light emitting elements may be inserted into the trench parts.

The third electrode may directly contact the second electrode exposed through the second opening of the second via layer.

The first electrode may directly contact the first ends of the light emitting elements, and the third electrode may directly contact the second ends of the light emitting elements.

The display device may further comprise a first connection electrode disposed on the first electrode; and a second connection electrode disposed between the third electrode and the second via layer, wherein the first connection electrode may directly contact the first ends of the light emitting elements and the first electrode, and the second connection electrode may directly contact the second ends of the light emitting elements and the second electrode.

The first via layer and the second via layer may each comprise an organic insulating material, and the second via layer may comprise a different organic insulating material from the organic insulating material of the first via layer.

The first via layer may comprise polyimide, and the second via layer may comprise a siloxane-based organic insulating material.

According to an embodiment, a display device may include a first via layer disposed on a substrate and comprising trench parts recessed from an upper surface of the first via layer; a first electrode and a second electrode that are disposed on the first via layer and spaced apart from each other; a second via layer disposed on the first via layer and comprising a base part; first openings formed in the base part that overlap the trench parts; a second opening partially exposing the second electrode; and bank parts protruding from an upper surface of the base part and spaced apart from each other; light emitting elements disposed in the first openings of the second via layer; sub electrodes disposed on the bank parts of the second via layer; and a third electrode disposed on the second via layer and the sub electrodes.

The first openings may be formed between the bank parts and overlap the trench parts in a thickness direction.

A diameter of each of the first openings may be reduced from an upper surface of the second via layer toward a bottom surface of the second via layer, and a maximum diameter of each of the first openings may be smaller than a maximum diameter of the second opening.

A part of inner walls of each of the first openings may directly contact a part of an outer surface of a light emitting element, and the second via layer may surround a part of each of the light emitting elements.

The maximum diameter of each of the first openings may be smaller than a gap between the bank parts.

Each of the light emitting elements may include a first end electrically connected to the first electrode; and a second end electrically connected to the third electrode, each of the light emitting elements may be disposed such that an extending direction of the light emitting elements is not parallel to an upper surface of the first substrate, and an angle formed by the extending direction of the light emitting elements and a direction perpendicular to the upper surface of the substrate may be in a range of about 0 degrees to about 60 degrees.

A thickness of the base part of the second via layer may be smaller than a thickness of a part of the second via layer on which the bank parts may be disposed, and the thickness of the part on which the bank parts may be disposed may be greater than a length of each light emitting element in the extending direction.

The first via layer may comprise polyimide, and the second via layer may comprise a siloxane-based organic insulating material.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
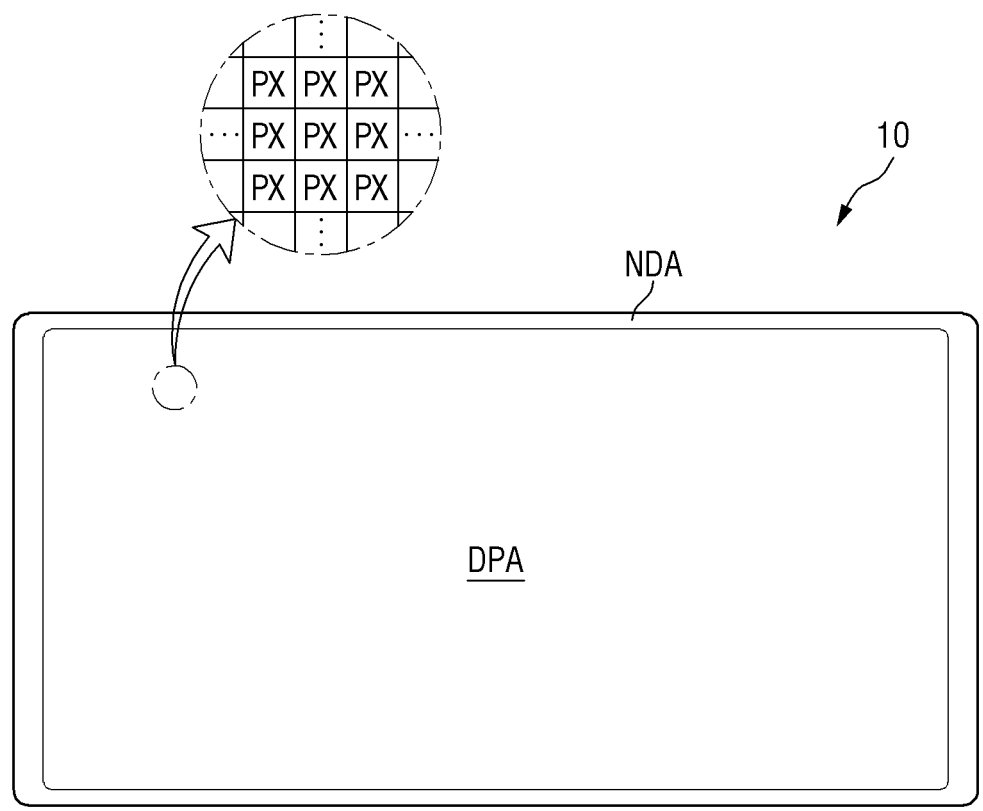
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device 10 according to an embodiment.

Referring to FIG. 1, the display device 10 displays moving images or still images. The display device 10 may refer to any electronic device that includes a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, and the like, all of which include a display screen.

The display device 10 may include a display panel that includes a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this, and other display panels can also be applicable within the spirit and the scope of the disclosure.

The shape of the display device 10 can be variously modified. For example, the display device 10 may have various shapes such as a substantially horizontally long rectangle, a substantially vertically long rectangle, substantially a square, substantially a quadrangle with rounded corners (vertices), other polygons, and substantially a circle. The shape of a display area DPA of the display device 10 may also be similar to the overall shape of the display device 10. In FIG. 1, the display device 10 may be shaped substantially like a rectangle that is long in a second direction DR2.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged or disposed in a matrix direction. Each of the pixels PX may be substantially rectangular or square in a plan view. However, the disclosure is not limited thereto, and each of the pixels PX may also have a substantially rhombic planar shape having each side inclined with respect to a direction. The pixels PX may be arranged or disposed in a stripe type or a PenTile® type. Each of the pixels PX may include one or more light emitting elements which emit light of a specific or given wavelength band to display a specific or given color.

The non-display area NDA may be disposed around the display area DPA. The non-display area NDA may entirely or partially surround or may be adjacent to the display area DPA. The display area DPA may be substantially rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
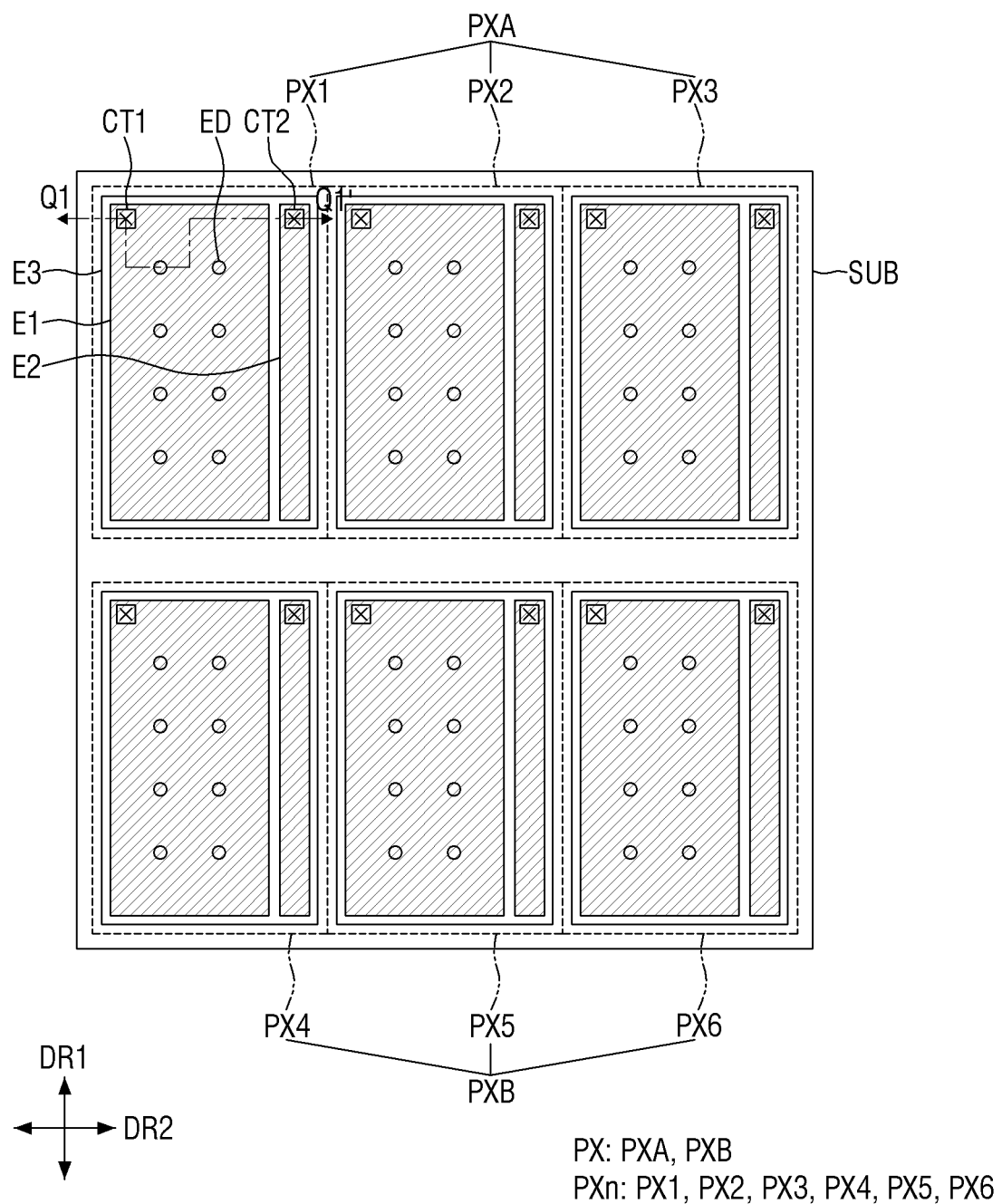
FIG. 2 is a schematic plan view of pixels of the display device according to an embodiment.

FIG. 2 is a schematic plan view of pixels PX of the display device 10 according to an embodiment. In FIG. 2, a plurality of pixels PX (PxA and PxB) neighboring in a first direction DR1 are illustrated together.

Referring to FIG. 2, each of the pixels PX of the display device 10 may include a plurality of subpixels PXn (where n is 1 to 6). For example, a first pixel PXA may include a first subpixel PX1, a second subpixel PX2 and a third subpixel PX3, and a second pixel PXB may include a fourth subpixel PX4, a fifth subpixel PX5 and a sixth subpixel PX6. The first subpixel PX1 and the fourth subpixel PX4 may emit light of a first color, the second subpixel PX2 and the fifth subpixel PX5 may emit light of a second color, and the third subpixel PX3 and the sixth subpixel PX6 may emit light of a third color. For example, the first color may be blue, the second color may be green, and the third color may be red. However, the disclosure is not limited thereto, and the subpixels PXn may also emit light of a same color. Although one pixel PXA or PXB may include three subpixels PXn in FIG. 2, the disclosure is not limited thereto, and the pixel PX may also include a larger number of subpixels PXn.

Each subpixel PXn of the display device 10 may include an emission area and a non-emission area. The emission area may be an area in which light emitting elements ED are disposed to emit light of a specific or given wavelength band, and the non-emission area may be an area in which the light emitting elements ED are not disposed and from which no light is output because light emitted from the light emitting elements ED may not reach this area. The emission area may include an area in which the light emitting elements ED are disposed and an area adjacent to the light emitting elements ED and to which light emitted from the light emitting elements ED is output.

However, the disclosure is not limited thereto, and the emission area may also include an area from which light emitted from the light emitting elements ED is output after being reflected or refracted by other members. A plurality of light emitting elements ED may be disposed in each subpixel PXn, and an area where the light emitting elements ED are disposed and an area adjacent to this area may form the emission area.

Figure 3:
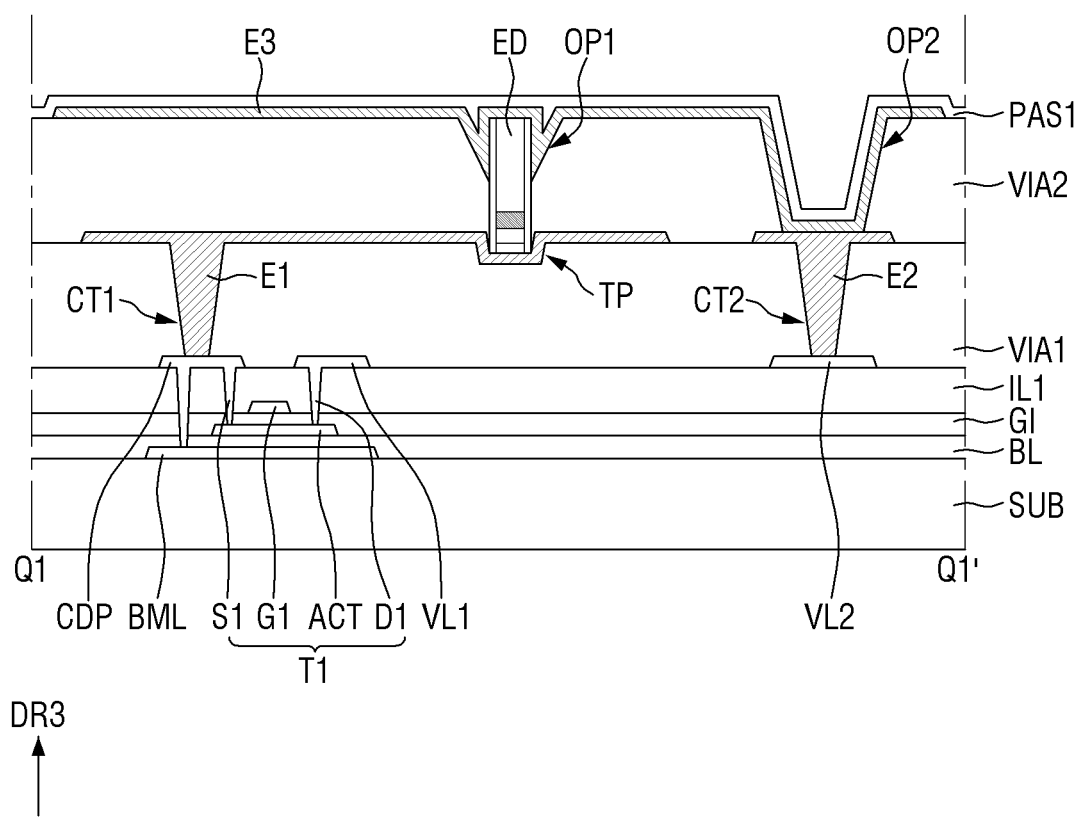
FIG. 3 is a schematic cross-sectional view taken along line Q1-Q1' of FIG. 2.
Figure 4:
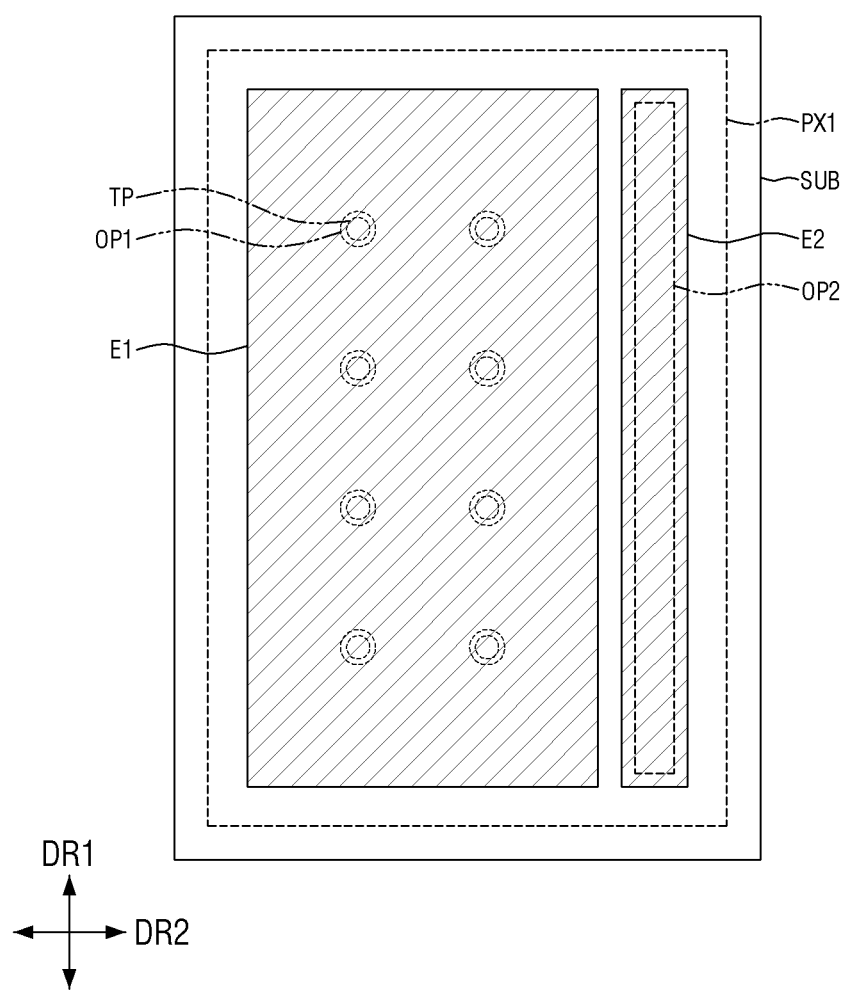
FIG. 4 is a schematic plan view illustrating the arrangement of first openings and a second opening in a first subpixel of FIG. 2.
Figure 5:
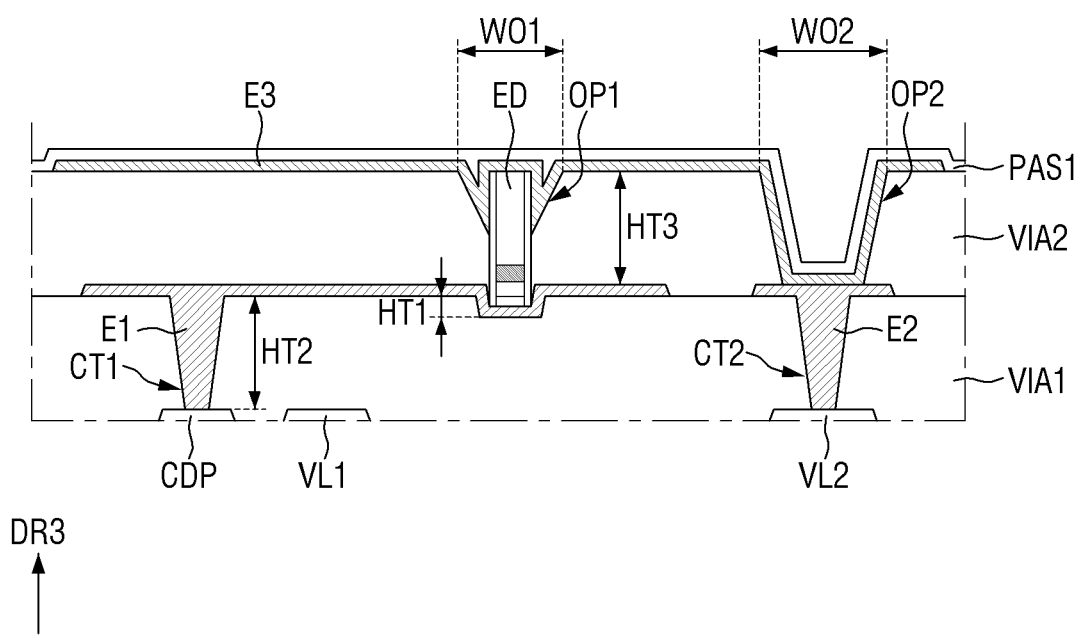
FIG. 5 is a schematic cross-sectional view illustrating a plurality of contact holes and a plurality of openings formed in a first via layer and a second via layer of FIG. 3.

FIG. 3 is a schematic cross-sectional view taken along line Q1-Q1' of FIG. 2. FIG. 4 is a schematic plan view illustrating the arrangement of first openings OP1 and a second opening OP2 in the first subpixel PX1 of FIG. 2. FIG. 5 is a schematic cross-sectional view illustrating a plurality of contact holes and a plurality of openings formed in a first via layer VIA1 and a second via layer VIA2 of FIG. 3. FIG. 3 illustrates a cross section across first through third electrodes E1 through E3 and a light emitting element ED disposed in the first subpixel PX1. FIG. 4 illustrates a relative arrangement of a plurality of trench parts TP, the first openings OP1 and the second opening OP2 with respect to a first electrode E1 and a second electrode E2 disposed in the first subpixel PX1.

Referring to FIGS. 3 through 5 in conjunction with FIG. 2, the display device 10 may include a first substrate SUB and a semiconductor layer, a plurality of conductive layers and a plurality of insulating layers disposed on the first substrate SUB.

The first substrate SUB may be an insulating substrate. The first substrate SUB may be made of an insulating material such as glass, quartz, or polymer resin or the like within the spirit and the scope of the disclosure. The first substrate SUB may be a rigid substrate, but may also be a flexible substrate that can be bent, folded, rolled, etc., within the spirit and the scope of the disclosure.

A first conductive layer may be disposed on the first substrate SUB. The first conductive layer may include a bottom metal layer BML, and the bottom metal layer BML may be overlapped by an active layer ACT of a first transistor T1. The bottom metal layer BML may include a light blocking material to prevent light from entering the active layer ACT of the first transistor T1. However, the bottom metal layer BML may also be omitted.

A buffer layer BL may be disposed on the bottom metal layer BML and the first substrate SUB. The buffer layer BL may be formed or disposed on the first substrate SUB to protect transistors of the pixels PX from moisture introduced through the first substrate SUB which may be vulnerable to moisture penetration and may perform a surface planarization function.

The semiconductor layer may be disposed on the buffer layer BL. The semiconductor layer may include the active layer ACT of the first transistor T1. The active layer ACT may be partially overlapped by a gate electrode G1 of a second conductive layer which will be described later.

The semiconductor layer may include polycrystalline silicon, monocrystalline silicon, an oxide semiconductor, or the like within the spirit and the scope of the disclosure. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel PXn of the display device 10 in the drawings, the disclosure is not limited thereto. The display device 10 may also include a larger number or any number of transistors.

A first gate insulating layer GI may be disposed on the semiconductor layer and the buffer layer BL. The first gate insulating layer GI may serve as a gate insulating film of the first transistor T1.

The second conductive layer may be disposed on the first gate insulating layer GI. The second conductive layer may include the gate electrode G1 of the first transistor T1. The gate electrode G1 may overlap a channel region of the active layer ACT in a third direction DR3 which is a thickness direction.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first voltage wiring VL1, a second voltage wiring VL2, and conductive patterns CDP.

A high potential voltage (or a first power supply voltage) supplied to the first electrode E1 may be applied to the first voltage wiring VL1, and a low potential voltage (or a second power supply voltage) supplied to the second electrode E2 may be applied to the second voltage wiring VL2. A part of the first voltage wiring VL1 may contact the active layer ACT of the first transistor T1 through a contact hole penetrating the first interlayer insulating layer IL1 and the first gate insulating layer GI. The first voltage wiring VL1 may serve as a first drain electrode D1 of the first transistor T1.

A first conductive pattern CDP may contact the active layer ACT of the first transistor T1 through a contact hole penetrating the first interlayer insulating layer IL1 and the first gate insulating layer GI. The first conductive pattern CDP may contact the bottom metal layer BML through another contact hole. The first conductive pattern CDP may serve as a first source electrode S1 of the first transistor T1.

Each of the buffer layer BL, the first gate insulating layer GI, and the first interlayer insulating layer IL1 described above may be composed of a plurality of inorganic layers alternately stacked each other. For example, each of the buffer layer BL, the first gate insulating layer GI, and the first interlayer insulating layer IL1 may be a double layer in which inorganic layers including at least any one of silicon oxide ($SiO_x$), silicon nitride ($SiN_x$) and silicon oxynitride ($SiO_xN_y$) may be stacked each other or may be a multilayer in which the inorganic layers may be alternately stacked each other. However, the disclosure is not limited thereto, and each of the buffer layer BL, the first gate insulating layer GI, and the first interlayer insulating layer IL1 may also be one inorganic layer including any one of the above insulating materials. In an embodiment, the first interlayer insulating layer IL1 may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (T1), nickel (Ni), neodymium (Nd), copper (Cu), and alloys of the same.

The first via layer VIA1 may be disposed on the third conductive layer. The first via layer VIA1 may be disposed in the entire display area DPA regardless of the pixels PX and the subpixels PXn. The first via layer VIA1 may include an organic insulating material such as polyimide (PI) and perform a surface planarization function.

According to an embodiment, the first via layer VIA1 may include a plurality of trench parts TP depressed or recessed from parts of an upper surface of the first via layer VIAL. The trench parts TP may be spaced apart from each other in the first direction DR1 and the second direction DR2 in each subpixel PXn. The trench parts TP may be disposed as island-like patterns in each subpixel PXn. A plurality of light emitting elements ED disposed in each subpixel PXn may be disposed to correspond to the trench parts TP of the first via layer VIAL. In one trench part TP, at least one or more light emitting elements ED may be disposed according to a width of the trench part TP. Since each of the trench parts TP may be depressed or recessed to a predetermined depth HT1 from the upper surface of the first via layer VIA1, the light emitting elements ED may be disposed such that an end of each of the light emitting elements ED may be inserted into the trench part TP. In an embodiment, the trench parts TP may be formed to have a substantially circular planar shape corresponding to the shape of each light emitting element ED. However, the disclosure is not limited thereto.

The first via layer VIA1 may include a plurality of contact holes CT1 and CT2 penetrating the first via layer VIA1 to expose parts of the conductive layer disposed under or below the first via layer VIAL. The contact holes CT1 and CT2 may expose the first conductive pattern CDP and the second voltage wiring VL2 of the third conductive layer, and the first electrode E1 and the second electrode E2 to be described later may be electrically connected or directly electrically connected to the third conductive layer through the contact holes CT1 and CT2, respectively. The trench parts TP and the contact holes CT1 and CT2 in the first via layer VIA1 may be formed by a patterning process using a halftone mask in the process of forming the first via layer VIA1. The first via layer VIA1 may have a generally flat upper surface, but the upper surface of the first via layer VIA1 may be stepped by the trench parts TP, or the first via layer VIA1 may be penetrated by the contact holes CT1 and CT2 in the thickness direction.

In an embodiment, a first depth HT1 of each trench part TP of the first via layer VIA1 may be smaller than a second depth HT2 of each of the contact holes CT1 and CT2. The first via layer VIA1 formed in a patterning process using a halftone mask may have a different thickness according to position. The first via layer VIA1 may have a generally flat upper surface, but the upper surface of the first via layer VIA1 may be depressed or recessed in parts in which the trench parts TP and the contact holes CT1 and CT2 may be formed, or the first via layer VIA1 may be stepped by being penetrated. The trench parts TP of the first via layer VIA1 may be formed to secure spaces into which the light emitting elements ED to be described later can be inserted, and the contact holes CT1 and CT2 may be formed to expose parts of the third conductive layer disposed under or below the contact holes CT1 and CT2. The trench parts TP and the contact holes CT1 and CT2 of the first via layer VIA1 may have different depths HT1 and HT2 according to their functions. For example, the trench parts TP may need a certain or determined depth so that the light emitting element ED can be inserted into the trench parts TP but may have the first depth HT1 appropriate for minimizing a step of a layer disposed on the trench parts in consideration of lengths of the light emitting elements ED and a thickness of a layer disposed on the first via layer VIAL.

The first electrode E1 and the second electrode E2 may be disposed on the first via layer VIAL. The first electrode E1 and the second electrode E2 may be disposed to correspond to each subpixel PXn of each pixel PX. For example, the second electrode E2 may be disposed on a right side of the center of each subpixel PXn which is a side of the second direction DR2, and the first electrode E1 may be spaced apart from the second electrode E2 in the second direction DR2. A plurality of first electrodes E1 disposed in a plurality of subpixels PXn may be spaced apart from each other in the first direction DR1 and the second direction DR2. Similarly, the second electrode E2 may also be spaced apart from the second electrodes E2 disposed in other subpixels PXn. The first electrode E1 and the second electrode E2 may be alternately and repeatedly disposed along the second direction DR2, and a plurality of first electrodes E1 and a plurality of second electrodes E2 may be repeatedly disposed at intervals along the first direction DR2.

The first electrode E1 may have a substantially angled shape in a plan view by including sides extending in the first direction DR1 and the other sides extending in the second direction DR2. However, the disclosure is not limited thereto, and the first electrode E1 may also be inclined with respect to a direction or may have a substantially circular shape with a curved outer surface. The size of the first electrode E1 is not particularly limited but may vary according to the area of each subpixel PXn of the display device 10. As illustrated in the drawings, the first electrode E1 may be formed smaller than each subpixel PXn so that it may be spaced apart from other first electrodes E1 at boundaries with other neighboring or adjacent subpixels PXn, and the first electrodes E1 may be disposed as island-like patterns in the entire display area DPA.

The second electrode E2 may also have a substantially angled shape in a plan view by including sides extending in the first direction DR1 and the other sides extending in the second direction DR2. However, compared with the first electrode E1, the second electrode E2 may look more like extending in the first direction DR1. For example, a width of the second electrode E2 measured in the second direction DR2 may be smaller than that of the first electrode E1, and the second electrodes E2 may be disposed as island-like patterns having a small width in the entire display area DPA. The second electrode E2 may also be inclined with respect to a direction or may have a substantially circular shape with a curved outer surface. The size of the second electrode E2 is not particularly limited but may vary according to the area of each subpixel PXn of the display device 10.

The first electrode E1 and the second electrode E2 may be electrically connected to the third conductive layer respectively through a first contact hole CT1 and a second contact hole CT2 formed in the first via layer VIA1 in each subpixel PXn. The first electrode E1 may contact the first conductive pattern CDP through the first contact hole CT1 penetrating the first via layer VIA1 disposed under or below the first electrode E1. The second electrode E2 may contact the second voltage wiring VL2 through the second contact hole CT2 penetrating the first via layer VIA1 disposed under or below the second electrode E2. The first electrode E1 may be electrically connected to the first transistor T1 through the first conductive pattern CDP to receive the first power supply voltage, and the second electrode E2 may be electrically connected to the second voltage wiring VL2 to receive the second power supply voltage.

According to an embodiment, the first electrode E1 may be disposed to cover or overlap the trench parts TP of the first via layer VIA1. The first electrode E1 may cover or overlap all of the trench parts TP formed in the first via layer VIA1 in each subpixel PXn and may have a stepped shape on the trench parts TP. An end of each of the light emitting elements ED may be inserted into a trench part TP by a step formed by the trench part TP and may be electrically connected to the first electrode E1 disposed on the trench part TP. Although the first electrode E1 disposed on a trench part TP contacts or directly contacts a light emitting element ED in FIG. 3, the disclosure is not limited thereto. The first electrode E1 may also be electrically connected to the light emitting element ED through another member.

Like the first electrode E1, the second electrode E2 may also be electrically connected to each light emitting element ED. The second electrode E2 may be electrically connected to the light emitting elements ED through a third electrode E3 to be described later, and the first electrode E1 and the second electrode E2 may transmit electrical signals received from the conductive layer under or below them to the light emitting elements ED.

The first electrode E1 and the second electrode E2 may include a conductive material having high reflectivity. For example, the first electrode E1 and the second electrode E2 may include a metal such as silver (Ag), copper (Cu) or aluminum (Al) as a material having high reflectivity or may be an alloy including aluminum (Al), nickel (Ni) or lanthanum (La). For example, the first electrode E1 may reflect light emitted from the light emitting elements ED disposed thereon toward above the first via layer VIAL.

However, the disclosure is not limited thereto, and the first electrode E1 and the second electrode E2 may further include a transparent conductive material. For example, the first electrode E1 and the second electrode E2 may include a material such as ITO, IZO or ITZO. In an embodiment, each of the first electrode E1 and the second electrode E2 may have a structure in which a transparent conductive material and a metal layer having high reflectivity may be each stacked in one or more layers or may be formed as a single layer including them. For example, the first electrode E1 and the second electrode E2 may have a stacked structure of ITO/Ag/ITO, ITO/Ag/IZO, or ITO/Ag/ITZO/IZO.

The second via layer VIA2 may be disposed on the first via layer VIA1, the first electrode E1, and the second electrode E2. Like the first via layer VIA1, the second via layer VIA2 may be disposed in the entire display area DPA regardless of the pixels PX and the subpixels PXn. For example, the first via layer VIA1 and the second via layer VIA2 may also be disposed at the boundaries of the subpixels PXn neighboring each other in the first direction DR1 and the second direction DR2. Like the first via layer VIA1, the second via layer VIA2 may planarize upper surfaces of some or a number of areas.

According to an embodiment, the second via layer VIA2 may include a light-transmitting organic insulating material different from the first via layer VIAL. The second via layer VIA2 may be a layer disposed on the first via layer VIA1, and the first via layer VIA1 and the second via layer VIA2 may have different positional relationships with the light emitting elements ED. The first via layer VIA1 may be a layer disposed under or below the light emitting elements ED and may not be required to transmit light emitted from the light emitting elements ED. However, the second via layer VIA2 may be a layer disposed on a same layer as the light emitting elements ED or a layer disposed on the light emitting elements ED. Thus, the second via layer VIA2 may be required to transmit light emitted from the light emitting elements ED.

In an embodiment, the first via layer VIA1 may include polyimide as an organic insulating material, and the second via layer VIA2 may include a siloxane-based organic insulating material. The siloxane-based organic insulating material may have a higher light transmittance for a specific or given wavelength band than polyimide. For example, for the light emitting elements ED emitting light in a visible region as a light source of the display device 10, the siloxane-based organic insulating material may have a higher transmittance of light emitted from the light emitting elements ED than polyimide. The second via layer VIA2 may include an organic insulating material to play a surface planarization role but may include a different material from the first via layer VIA1 to transmit light emitted from the light emitting elements ED.

The second via layer VIA2 may include the first openings OP1 and the second opening OP2. The first openings OP1 and the second opening OP2 may be formed in each subpixel PXn. The first openings OP1 may overlap the first electrode E1 in the thickness direction and expose parts of an upper surface of the first electrode E1. The second opening OP2 may overlap the second electrode E2 in the thickness direction and expose a part of an upper surface of the second electrode E2.

According to an embodiment, the first openings OP1 may be formed to correspond to the trench parts TP of the first via layer VIA1, respectively. The first openings OP1 may be spaced apart from each other in the first direction DR1 and the second direction DR2 in each subpixel PXn. The first openings OP1 may be disposed as island-like patterns in each subpixel PXn.

The first openings OP1 may form spaces in which the light emitting elements ED may be disposed, together with the trench parts TP of the first via layer VIAL. The first openings OP1 may expose parts of the first electrode E1, and the light emitting elements ED may be inserted into the first openings OP1 and the trench parts TP to contact or directly contact or to be electrically connected to the first electrode E1. In an embodiment, the first openings OP1 may have a substantially circular shape in a plan view, and a maximum diameter WO1 of each first opening OP1 may be greater than a diameter of each trench part TP. The diameter of each first opening OP1 may decrease from an upper surface of the second via layer VIA2 toward the bottom surface of the second via layer VIA2, and a diameter of a lower end of each first opening OP1 may be similar to the diameter of each trench part TP.

The second opening OP2 may be disposed on the second electrode E2 to extend in a direction. The second opening OP2 may extend in the first direction DR1 in which the second electrode E2 extends and may have a similar shape to the second electrode E2. A length of the second opening OP2 in the first direction DR1 in a plan view may be greater than a width of the second opening OP2 in the second direction DR2, but the length and width of the second opening OP2 may be smaller than those of the second electrode E2. However, the disclosure is not limited thereto, and the second opening OP2 may also extend in the first direction DR1 to overlap the second electrodes E2 disposed in the subpixels PXn neighboring in the first direction DR1. The second opening OP2 may expose a part of the upper surface of the second electrode E2, and the third electrode E3 to be described later may be electrically connected to the second electrode E2 through the second opening OP2.

The light emitting elements ED may be disposed in the first openings OP1 of the second via layer VIA2. The first openings OP1 disposed on the first electrode E1 and spaced apart from each other in the first direction DR1 and the second direction DR2 may be located or disposed in each subpixel PXn, and the light emitting elements ED disposed in the first openings OP1 may be spaced apart from each other. Although one light emitting element ED is disposed in one first opening OP1 in the drawings, the disclosure is not limited thereto, and at least one or more light emitting elements ED may also be disposed in each first opening OP1.

According to an embodiment, the light emitting elements ED may extend in a direction, and the direction in which the light emitting elements ED extend may not be parallel to an upper surface of the first substrate SUB. The light emitting elements ED in the first openings OP1 may have first ends inserted into the trench parts TP of the first via layer VIA1 and may be erected or disposed in the first openings OP1 in a direction perpendicular to the upper surface of the first substrate SUB or a direction not perpendicular to the upper surface of the first substrate SUB. In an embodiment, the maximum diameter WO1 of each first opening OP1 of the second via layer VIA2 may be smaller than the length of each light emitting element ED in the extending direction of the light emitting element ED. Each first opening OP1 of the second via layer VIA2 may have a diameter WO1 that allows only one or an end of each light emitting element ED to be inserted into the first opening OP1 instead of allowing the light emitting element ED to be completely disposed inside of the hole.

According to an embodiment, inner walls of each first opening OP1 of the second via layer VIA2 may partially contact an outer surface of a light emitting element ED. Each first opening OP1 may have the maximum diameter WO1 at a part contacting the upper surface of the second via layer VIA2 and may be reduced in diameter from the upper surface of the second via layer VIA2 toward the bottom surface of the second via layer VIA2. The diameter of each first opening OP1 may be reduced up to a part where the inner walls contact the outer surface of a light emitting element ED, and the diameter of the part where the inner walls contact the outer surface of the light emitting element ED may be substantially equal to the diameter of the light emitting element ED. The second via layer VIA2 may be formed such that part of the inner walls of each first opening OP1 surrounds the outer surface of a light emitting element ED and may fix the light emitting elements ED in a direction in which the light emitting elements ED are erected or disposed on the first substrate SUB. Although the light emitting elements ED may be disposed in the direction perpendicular to the upper surface of the first substrate SUB in the drawings, the disclosure is not limited thereto. The light emitting elements ED may also be disposed at least in a direction not parallel to the upper surface of the first substrate SUB, and some or a number of light emitting elements ED may be disposed in the direction perpendicular to the upper surface of the first substrate SUB according to process conditions of a manufacturing process.

A depth of each first opening OP1 may be determined by a thickness HT3 of the second via layer VIA2 and may vary according to the length of each light emitting element ED and the first depth HT1 of each trench part TP of the first via layer VIA1. According to an embodiment, each of the first depth HT1 of each trench part TP and the thickness HT3 of the second via layer VIA2 may be smaller than the length of each light emitting element ED in the extending direction of the light emitting element ED. As described above, each trench part TP may have a depth that allows a part of an end of a light emitting element ED to be inserted into the trench part TP. The thickness HT3 of the second via layer VIA2 may be adjusted within the range in which a step of a layer disposed on the second via layer VIA2 can be minimized by the first openings OP1 and the light emitting elements ED. If the thickness HT3 of the second via layer VIA2 is greater than the length of each light emitting element ED, a part of an upper surface of the layer disposed on the second via layer VIA2 may be depressed or recessed, thereby forming a step. In case that the thickness HT3 of the second via layer VIA2 is too small, an end of each light emitting element ED may protrude above the upper surface of the second via layer VIA2. Accordingly, the layer disposed on the second via layer VIA2 may be stepped. The first depth HT1 of each trench part TP of the first via layer VIA1 and the thickness HT3 of the second via layer VIA2 may be variously adjusted according to the length of each light emitting element ED within the range in which a step of a layer disposed on each of the trench part TP and the second via layer VIA2 can be minimized. For example, the first depth HT1 of each trench part TP may be about 25% of the length of each light emitting element ED, and the thickness HT3 of the second via layer VIA2 may be about 75% of the length of each light emitting element ED. However, the disclosure is not limited thereto.

After the light emitting elements ED are placed, the first openings OP1 of the second via layer VIA2 may be formed to contact the light emitting elements ED in the process of curing an organic insulating material layer for forming the second via layer VIA2 through heat treatment. The organic insulating material layer formed in a patterning process using a halftone mask may include openings having a greater diameter than the first openings OP1. A light emitting element ED may be disposed in each of the openings and may be disposed in an inclined state on inclined inner walls of the opening. In case that the organic insulating material layer is cured in a heat treatment process, material reflow may occur as organic insulating materials flow with fluidity. As a result, the width or diameter of each opening may be reduced. In this process, the inner walls of each opening may contact a part of the outer surface of the light emitting element ED and fix the light emitting element ED in the direction in which the light emitting element ED is erected or disposed on the upper surface of the first substrate SUB.

Light generated by the light emitting elements ED may be emitted without directionality, but most of the light may be emitted through both ends, for example, the first and second ends in the extending direction of the light emitting elements ED. Since the light emitting elements ED extend in a direction not parallel to the upper surface of the first substrate SUB, light emitted at least through the second ends of the light emitting elements ED may be directed upward or directly directed upward above the first substrate SUB. In the display device 10 according to the embodiment, the first openings OP1 of the second via layer VIA2 may be formed by reflowing an organic insulating material, and the second via layer VIA2 may fix the light emitting elements ED to be erected or disposed vertically. Even if the display device 10 may include the light emitting elements ED which emit light through both ends in the extending direction of the light emitting elements ED, light emission efficiency of the display device 10 can be improved. For example, since a structure reflecting light emitted from the light emitting elements ED can be omitted from the display device 10, there is an advantage in securing a space in the manufacturing process and the structure design of each subpixel PXn.

The second opening OP2 may also be formed in the reflow process for forming the first openings OP1 and fixing the light emitting elements ED. Since the light emitting elements ED may not be disposed in the second opening OP2, the second opening OP2 may also not be formed depending on the conditions of the heat treatment process, and an organic insulating material may cover or overlap the second electrode E2 instead. To prevent this, according to an embodiment, a maximum diameter WO2 of the second opening OP2 may be greater than the maximum diameter WO1 of each first opening OP1. In an organic insulating material layer for forming the second via layer VIA2, a plurality of sub openings OP1_C and OP2_C (see FIG. 10) may be formed to form the first openings OP1 and the second opening OP2, respectively. Among them, the sub opening OP2_C for forming the second opening OP2 may have a greater maximum diameter than the sub openings OP1_C for forming the first openings OP1. In the process of curing the organic insulating material layer for forming the second via layer VIA2, a diameter of each of the sub openings OP1_C and OP2_C may be reduced at a constant rate. A light emitting element ED may be disposed in any one sub opening OP1_C to cause reflow in the curing process to form each first opening OP1. The other sub opening OP2_C may be reduced in diameter at a constant rate. However, since the initial diameter of the sub opening OP2_C may be large, the sub opening OP2_C may be cured in a state where the second electrode E2 may be exposed. The sub openings OP1_C and OP2_C of the organic insulating material layer may each be reduced in diameter in the curing process and may form the first openings OP1 and the second opening OP2.

Each of the light emitting elements ED may include a plurality of semiconductor layers, and the first end and the second end opposite the first end may be defined based on any one semiconductor layer. The first ends of the light emitting elements ED may face the first electrode E1, and the second ends may face upward above the second via layer VIA2. The light emitting elements ED may have the first ends electrically connected to the first electrode E1 and the second ends electrically connected to the second electrode E2 to receive electrical signals to emit light. In an embodiment, the first ends of the light emitting elements ED may contact or directly contact and be electrically connected to the first electrode E1, and the second ends may contact or directly contact the third electrode E3 and thus may be electrically connected to the second electrode E2. A part of a semiconductor layer may be exposed on an end surface of each light emitting element ED in the extending direction, and the exposed semiconductor layer may contact or directly contact the first electrode E1 or the third electrode E3. However, the disclosure is not limited thereto, and the light emitting elements ED may also contact other members and may be electrically connected to the first electrode E1 and the second electrode E2 through the members.

The light emitting elements ED disposed in different subpixels PXn may emit light of different wavelength bands depending on the materials that form the semiconductor layers. However, the disclosure is not limited thereto, and the light emitting elements ED disposed in different subpixels PXn may also emit light of a same color, for example, blue light.

The third electrode E3 may be disposed on the second via layer VIA2 and the light emitting elements ED. The third electrode E3 may be disposed to correspond to each subpixel PXn of each pixel PX. For example, the third electrode E3 may be large enough to cover or overlap the first electrode E1 and the second electrode E2 of each subpixel PXn. Therefore, the area occupied by each subpixel PXn may be almost similar to the area of the third electrode E3. The third electrode E3 may be formed smaller than each subpixel PXn so that it may be spaced apart from other third electrodes E3 at boundaries with other neighboring subpixels PXn, and the third electrodes E3 may be disposed as island-like patterns in the entire display area DPA. However, the disclosure is not limited thereto, and the third electrode E3 may also be disposed to cover or overlap a plurality of subpixels PXn and, in some instances, may be disposed as one electrode over the entire display area DPA.

The third electrode E3 may be electrically connected to the light emitting elements ED through the first openings OP1 formed in the second via layer VIA2 and may be electrically connected to the second electrode E2 through the second opening OP2. For example, the third electrode E3 may contact or directly contact the second ends of the light emitting elements ED disposed in the first openings OP1 and may contact or directly contact a part of the upper surface of the second electrode E2 exposed through the second opening OP2. However, the disclosure is not limited thereto, and the third electrode E3 may also be electrically connected to the light emitting elements ED and the second electrode E2 through another member disposed between the third electrode E3 and the second via layer VIA2.

According to an embodiment, the third electrode E3 may include a transparent conductive material, unlike the first electrode E1 and the second electrode E2. The third electrode E3 may be a layer disposed on the light emitting elements ED and, like the second via layer VIA2, may include a material that transmits light emitted from the light emitting elements ED. For example, the second electrode E2 may include a transparent material such as ITO, IZO or ITZO or a material such as Ag/Mg. A part of light emitted from the light emitting elements ED may pass through the second via layer VIA2 and the third electrode E3 to travel upward above the first substrate SUB, and the other part of the light may be reflected by the first electrode E1 to pass through the second via layer VIA2 and the third electrode E3.

A first insulating layer PAS1 may be disposed on the second via layer VIA2 and the third electrode E3. The first insulating layer PAS1 may be entirely disposed on the second via layer VIA2 and may protect the members disposed on the first substrate SUB from the external environment. The first insulating layer PAS1 may include, but is not limited to, a transparent inorganic insulating material or a transparent organic insulating material to transmit light emitted from the light emitting elements ED.

Figure 6:
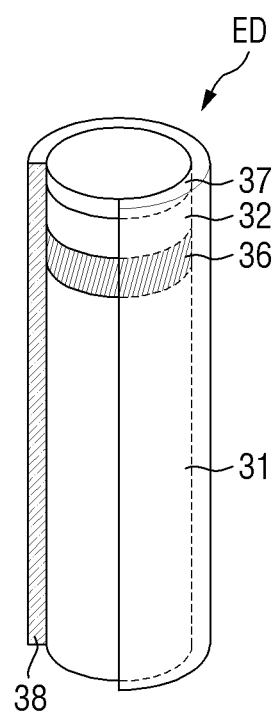
FIG. 6 is a schematic view of a light emitting element according to an embodiment.

FIG. 6 is a schematic view of a light emitting element ED according to an embodiment.

Referring to FIG. 6, the light emitting element ED may be a light emitting diode. For example, the light emitting element ED may be an inorganic light emitting diode having a size in a range of nanometers to micrometers and made of an inorganic material. In case that an electric field is formed in a specific or given direction between two electrodes facing each other, the light emitting element ED may be aligned between the two electrodes in which polarities are formed.

The light emitting element ED according to an embodiment may extend in a direction. The light emitting element ED may be shaped substantially like a cylinder, a rod, a wire, a tube, or the like within the spirit and the scope of the disclosure. However, the shape of the light emitting element ED is not limited thereto, and the light emitting element ED may also have various shapes including substantially polygonal prisms, such as a cube, a rectangular parallelepiped and a hexagonal prism, and a shape extending in a direction and having a partially inclined outer surface.

The light emitting element ED may include a semiconductor layer doped with impurities of any conductivity type (for example, a p type or an n type). The semiconductor layer may receive an electrical signal from an external power source and emit light of a specific or given wavelength band. The light emitting element ED may include a first semiconductor layer 31, a second semiconductor layer 32, a light emitting layer 36, an electrode layer 37, and the insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. An n-type dopant used to dope the first semiconductor layer 31 may be Si, Ge, Sn, or the like within the spirit and the scope of the disclosure.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and InN. A p-type dopant used to dope the second semiconductor layer 32 may be Mg, Zn, Ca, Se, Ba, or the like within the spirit and the scope of the disclosure.

Although each of the first semiconductor layer 31 and the second semiconductor layer 32 is composed of a layer in the drawing, the disclosure is not limited thereto. Each of the first semiconductor layer 31 and the second semiconductor layer 32 may also include a larger number of layers, for example, may further include a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 may include a material having a multiple quantum well structure, it may have a structure in which a plurality of quantum layers and a plurality of well layers may be alternately stacked each other. The light emitting layer 36 may emit light through combination of electron-hole pairs according to electrical signals received through the first semiconductor layer 31 and the second semiconductor layer 32. The light emitting layer 36 may include a material such as AlGaN or AlGaInN. Byway of example, in case that the light emitting layer 36 has a multiple quantum well structure in which a quantum layer and a well layer may be alternately stacked each other, the quantum layer may include a material such as AlGaN or AlGaInN, and the well layer may include a material such as GaN or AlInN, for example.

The light emitting layer 36 may also have a structure in which a semiconductor material having a large band gap energy and a semiconductor material having a small band gap energy may be alternately stacked each other or may include different group three to five semiconductor materials depending on the wavelength band of light that it emits. Light emitted from the light emitting layer 36 is not limited to light in a blue wavelength band. In some instances, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36 but may expose both ends of the light emitting element ED in a longitudinal direction. An upper surface of the insulating film 38 may be substantially rounded in cross section in an area adjacent to at least an end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In an embodiment, the insulating film 38 may be formed in a multilayer structure in which a plurality of layers may be stacked each other.

The insulating film 38 may protect the above members. The insulating film 38 may prevent an electrical short circuit that may occur in the light emitting layer 36 in case that the light emitting layer 36 contacts or directly contacts an electrode through which an electrical signal is transmitted to the light emitting element ED. The insulating film 38 may prevent a reduction in luminous efficiency of the light emitting element ED.

An outer surface of the insulating film 38 may be treated. A plurality of light emitting elements ED may be sprayed onto electrodes in a state where they are dispersed in a predetermined ink and may be aligned. Here, the surface of the insulating film 38 may be hydrophobic or hydrophilic-treated so that each light emitting element ED remains separate from other adjacent light emitting elements ED in the ink without being agglomerated with them.

Figure 7:
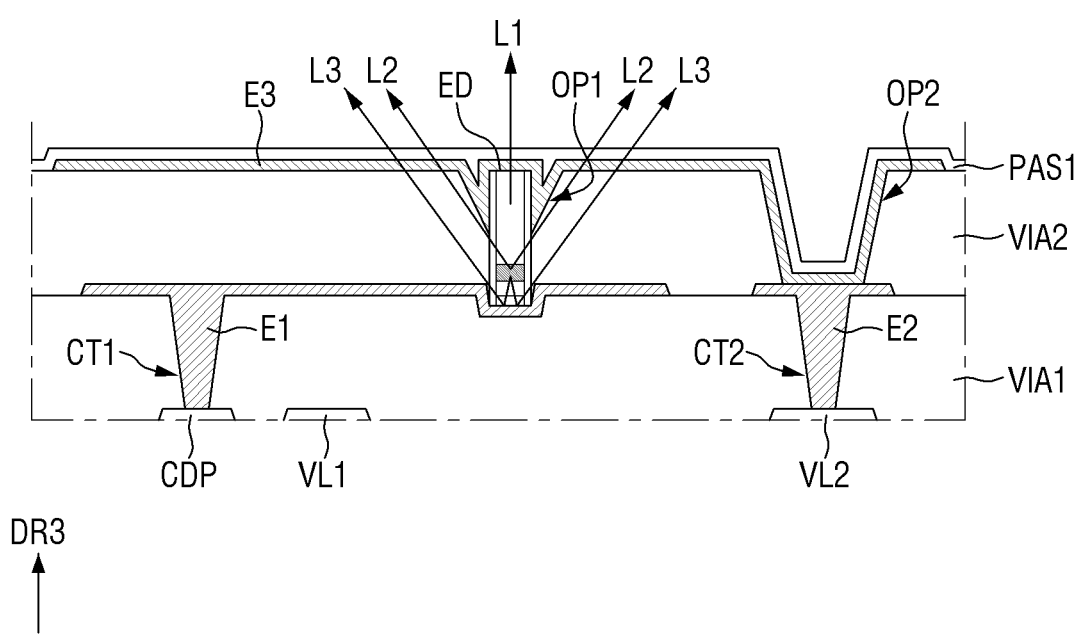
FIG. 7 is a schematic view illustrating paths through which light generated by a light emitting element of the display device according to an embodiment is emitted.

FIG. 7 is a schematic view illustrating paths through which light generated by a light emitting element ED of the display device 10 according to the embodiment is emitted.

Referring to FIG. 7, the display device 10 according to an embodiment may include a light emitting element ED disposed in a first opening OP1, and the light emitting element ED may extend in the direction perpendicular to the upper surface of the first substrate SUB. In the light emitting element ED, light may be generated by the light emitting layer 36 and may be emitted in random directions without directionality. Of the light generated by the light emitting element ED, first light L1 emitted through the second end may pass through the third electrode E3 and the first insulating layer PAS1 to travel upward above the first substrate SUB.

Of the light generated by the light emitting element ED, second light L2 emitted through side surfaces of the light emitting element ED may be incident on the second via layer VIA2. According to an embodiment, the second via layer VIA2 may have a high transmittance of light having a wavelength in a visible light region by including a siloxane-based organic insulating material as a transparent organic insulating material. For example, in an embodiment in which the light emitting element ED emits blue light, the siloxane-based organic insulating material may have an excellent light transmittance compared with polyimide. The second light L2 emitted through the side surfaces of the light emitting element ED may pass through the second via layer VIA2, the third electrode E3 and the first insulating layer PAS1 to travel upward above the first substrate SUB.

Of the light generated by the light emitting element ED, third light L3 emitted through the first end of the light emitting element ED may be incident on the first electrode E1. The first electrode E1 may include a material having high reflectivity, and the third light L3 may be reflected by the first electrode E1 to the second via layer VIA2. The third light L3 may also pass through the second via layer VIA2, the third electrode E3 and the first insulating layer PAS1 to travel upward above the first substrate SUB.

In the display device 10 according to an embodiment, the light emitting element ED extending in a direction may be disposed in the direction perpendicular to the first substrate SUB. The light emitting element ED may be disposed on a trench part TP of the first via layer VIA1 in the first opening OP1 of the second via layer VIA2 and may be fixed and erected or upright or disposed by the second via layer VIA2. The light generated by the light emitting element ED may be emitted through both ends in the extending direction, but a part of the light may be emitted through the side surfaces. Here, most of the light emitted through both ends of the light emitting element ED disposed in the direction perpendicular to the first substrate SUB may travel upward above the first substrate SUB. Since the second via layer VIA2 may include a material having high light transmittance, the light emitted through the side surfaces of the light emitting element ED may also travel upward above the first substrate SUB. Therefore, the display device 10 may have excellent luminous efficiency.

A process of manufacturing the display device 10 will now be described with further reference to other drawings.

FIGS. 8 through 15 are schematic cross-sectional views sequentially illustrating a process of manufacturing a display device according to an embodiment. FIGS. 8 through 15 schematically illustrate a process of forming each layer of the display device 10. The order of forming each layer will be described in detail below, and the process or method of forming each layer will be described.

Figure 8:
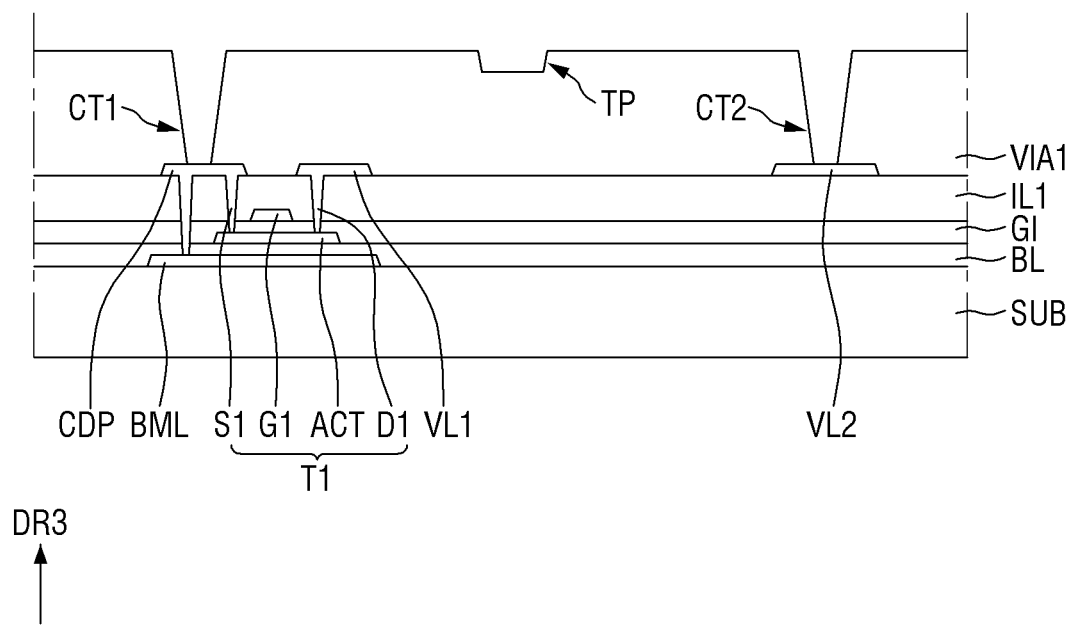
FIGS. 8 through 15 are schematic cross-sectional views sequentially illustrating a process of manufacturing a display device according to an embodiment.

First, referring to FIG. 8, a semiconductor layer, a buffer layer BL, a first conductive layer, a first gate insulating layer GI, a second conductive layer, a first interlayer insulating layer IL1, a third conductive layer, and a first via layer VIA1 may be formed on a first substrate SUB. The semiconductor layer, the first conductive layer, the second conductive layer, and the third conductive layer may be formed by a patterning process using a mask. The buffer layer BL, the first gate insulating layer GI, and the first interlayer insulating layer IL1 may be formed by a deposition process such as a chemical vapor deposition (CVD) method or other process within the spirit and the scope of the disclosure.

The first via layer VIA1 may include an organic insulating material and may be formed by a patterning process using a halftone mask. The first via layer VIA1 may have a generally flat upper surface and perform a surface planarization function but may include a plurality of trench parts TP and a first contact hole CT1 and a second contact hole CT2 disposed in each subpixel PXn. The first contact hole CT1 and the second contact hole CT2 may be formed deeper than the trench parts TP to expose parts of the third conductive layer under or below them. The trench parts TP may be depressed or recessed from parts of the upper surface of the first via layer VIA1, and a depth of each trench part TP may be adjusted according to a length of each light emitting element ED.

Figure 9:
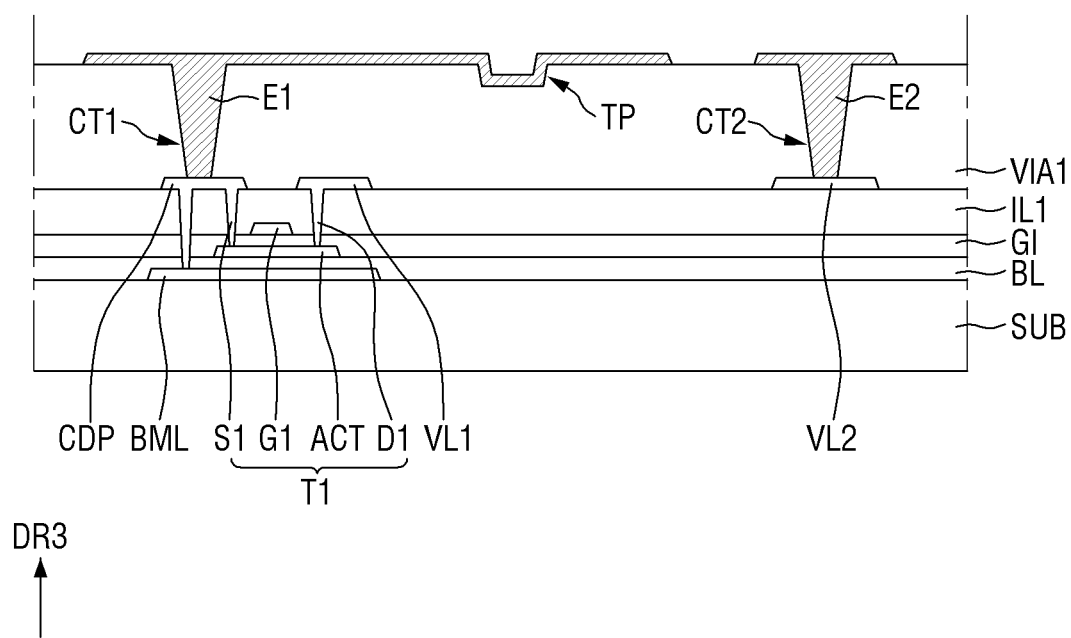

Referring to FIG. 9, a first electrode E1 and a second electrode E2 may be formed on the first via layer VIAL The first electrode E1 may cover or overlap the trench parts TP and may contact or directly contact the third conductive layer through the first contact hole CT1. The second electrode E2 may be spaced apart from the first electrode E1 and may contact or directly contact the third conductive layer through the second contact hole CT2.

Figure 10:
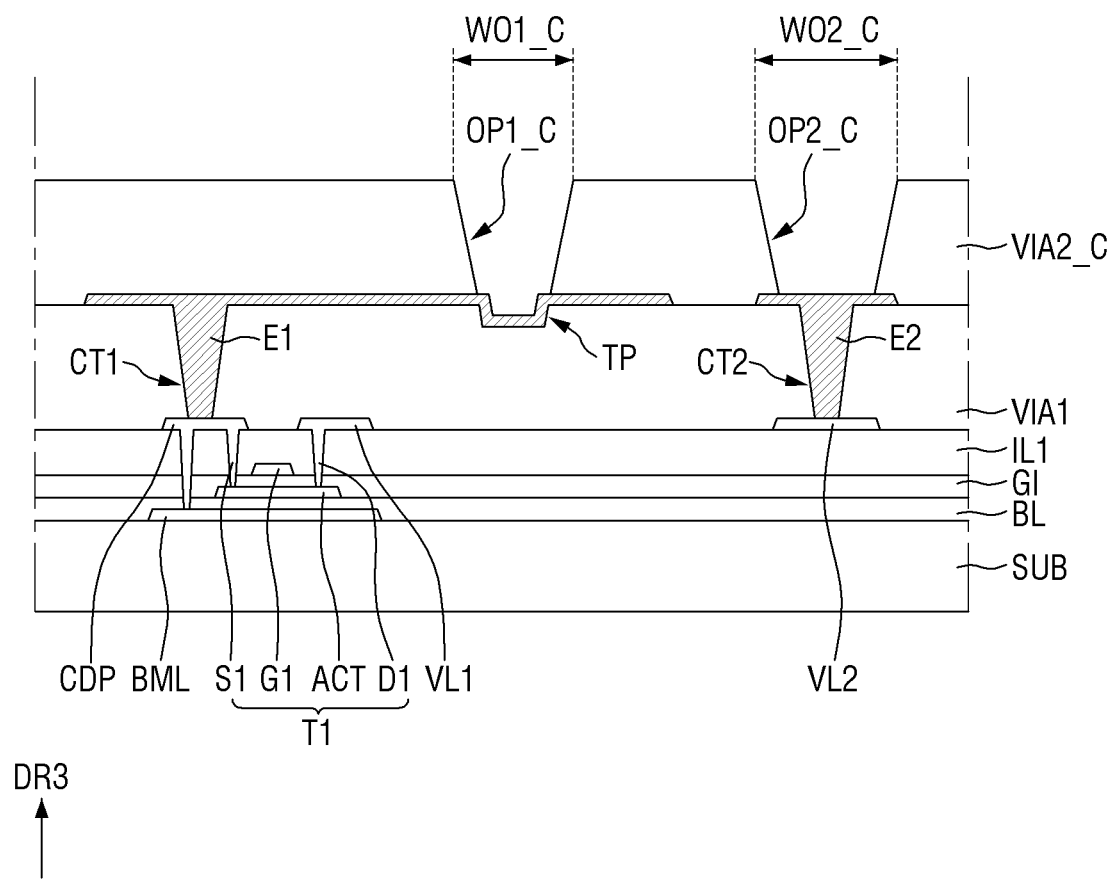
Figure 11:
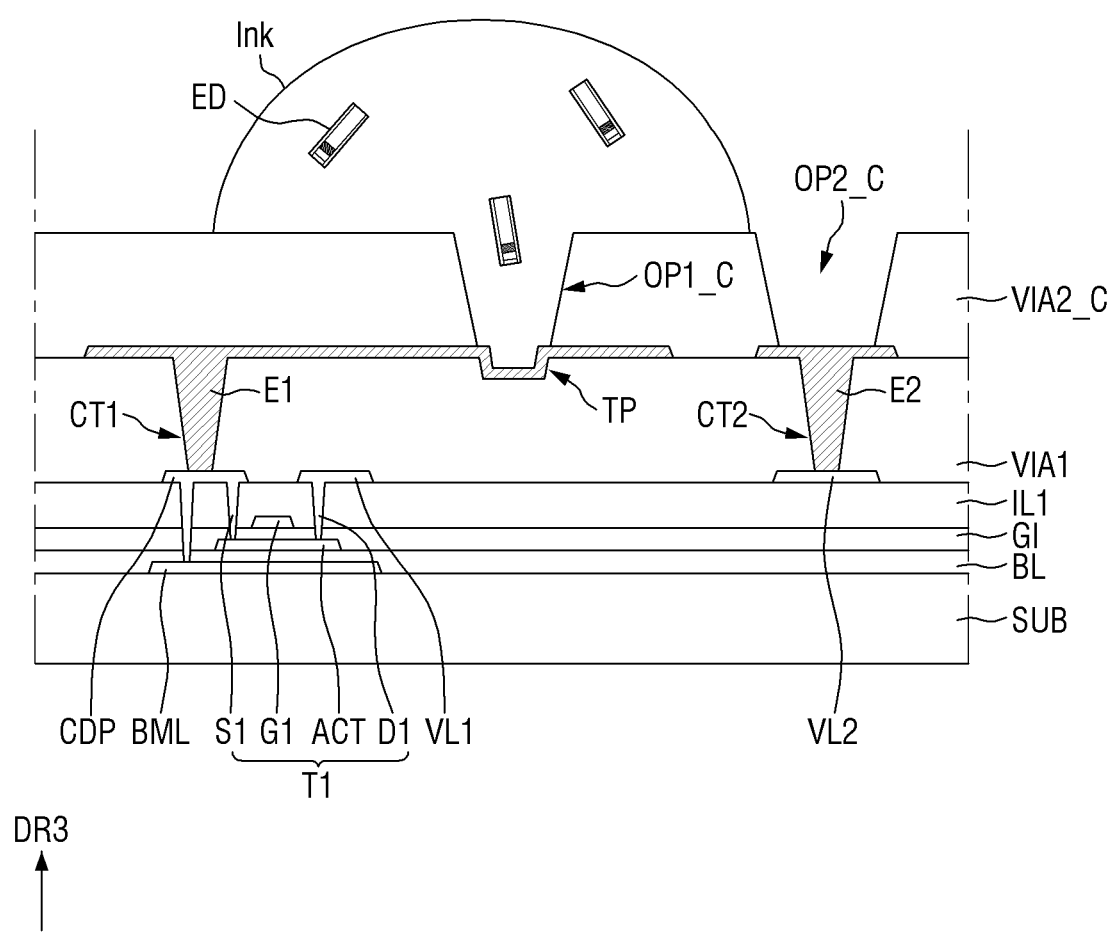

Referring to FIG. 10, a second sub via layer VIA2_C may be formed on the first via layer VIA1. Like the first via layer VIA1, the second sub via layer VIA2_C may be formed by a patterning process using a halftone mask. However, unlike the first via layer VIA1, the second sub via layer VIA2_C may be made of a siloxane-based organic insulating material and may include first sub openings OP1_C and a second sub opening OP2_C partially exposing upper surfaces of the first electrode E1 and the second electrode E2, respectively. The first sub openings OP1_C may be formed to correspond to the trench parts TP of the first via layer VIA1. In a subsequent process, ends of the light emitting elements ED may be inserted into the trench parts TP in the first sub openings OP1_C.

A maximum diameter WO1_C of each first sub opening OP1_C may be smaller than a maximum diameter WO2_C of the second sub opening OP2_C. The second sub via layer VIA2_C may be cured through a heat treatment process in a subsequent process to form the second via layer VIA2 of FIG. 3. In the heat treatment process, widths or diameters of the first sub openings OP1_C and the second sub opening OP2_C may be reduced by the reflow of the organic insulating material. Each of the first sub openings OP1_C and the second sub opening OP2_C may be reduced in diameter by a predetermined size. Since the second sub opening OP2_C has a greater maximum diameter than the first sub openings OP1_C, first openings OP1 and a second opening OP2 formed in the second via layer VIA2 may have different diameters. This may allow the second via layer VIA2 to fix the light emitting elements ED disposed in the first openings OP1 while preventing the second electrode E2 under or below the second via layer VIA2 from being covered or overlapped by the organic insulating material instead of being exposed in the second opening OP2.

Referring to FIGS. 11 through 14, the light emitting elements ED may be placed in the first sub openings OP1_C. In an embodiment, the light emitting elements ED may be prepared in a state where they are dispersed in ink Ink and may be sprayed to each subpixel PXn through an inkjet printing process. The ink Ink may be sprayed onto the first sub openings OP1_C of the second sub via layer VIA2_C, and the light emitting elements ED may be mounted on the first sub openings OP1_C.

Figure 12:
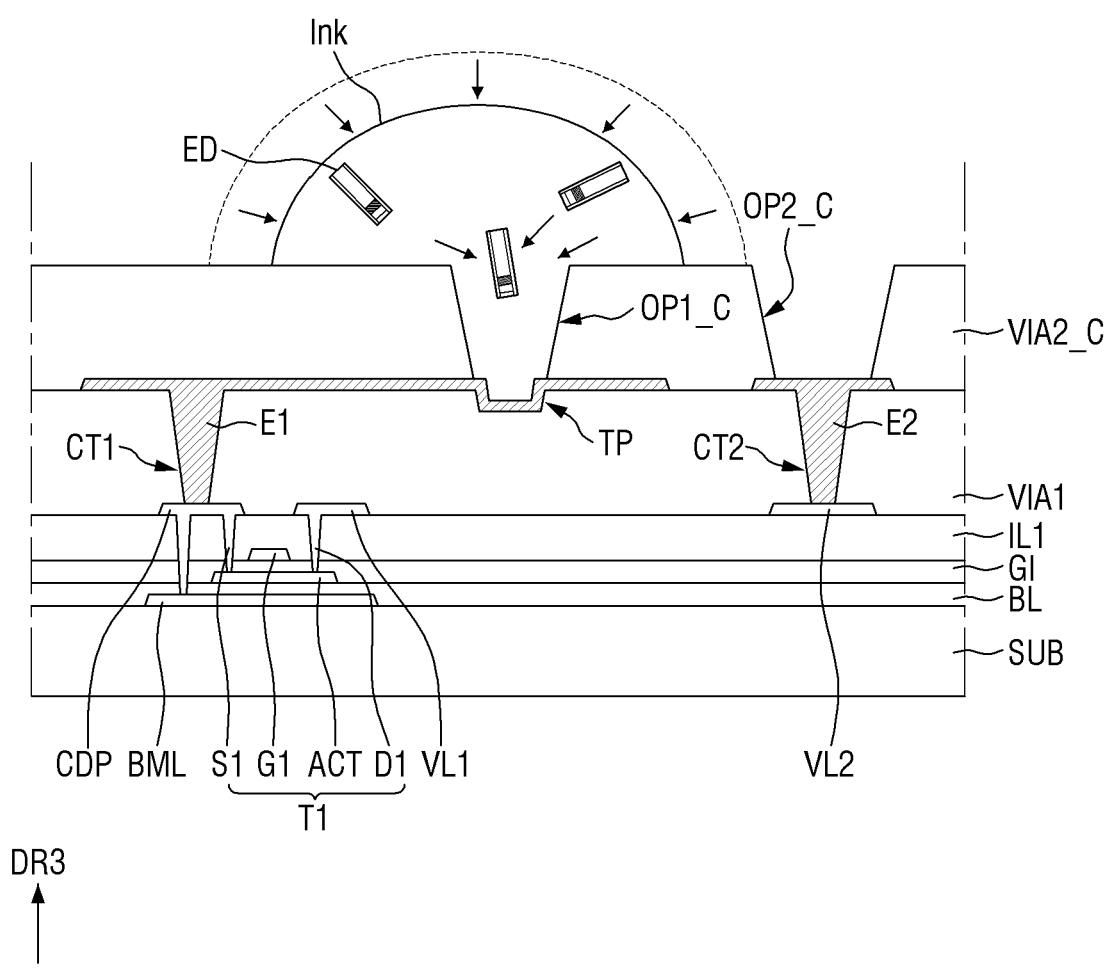

The ink Ink may start to dry from the periphery or the surface rather than from the center. As illustrated in FIG. 12, as the ink Ink dries, an ink medium or ink molecules may move toward the center. Accordingly, the light emitting elements ED dispersed in the ink Ink may also move. Some or a number of the light emitting elements ED may be placed in the first sub openings OP1_C along the slopes formed by the first sub openings OP1_C of the second sub via layer VIA2_C.

Figure 13:
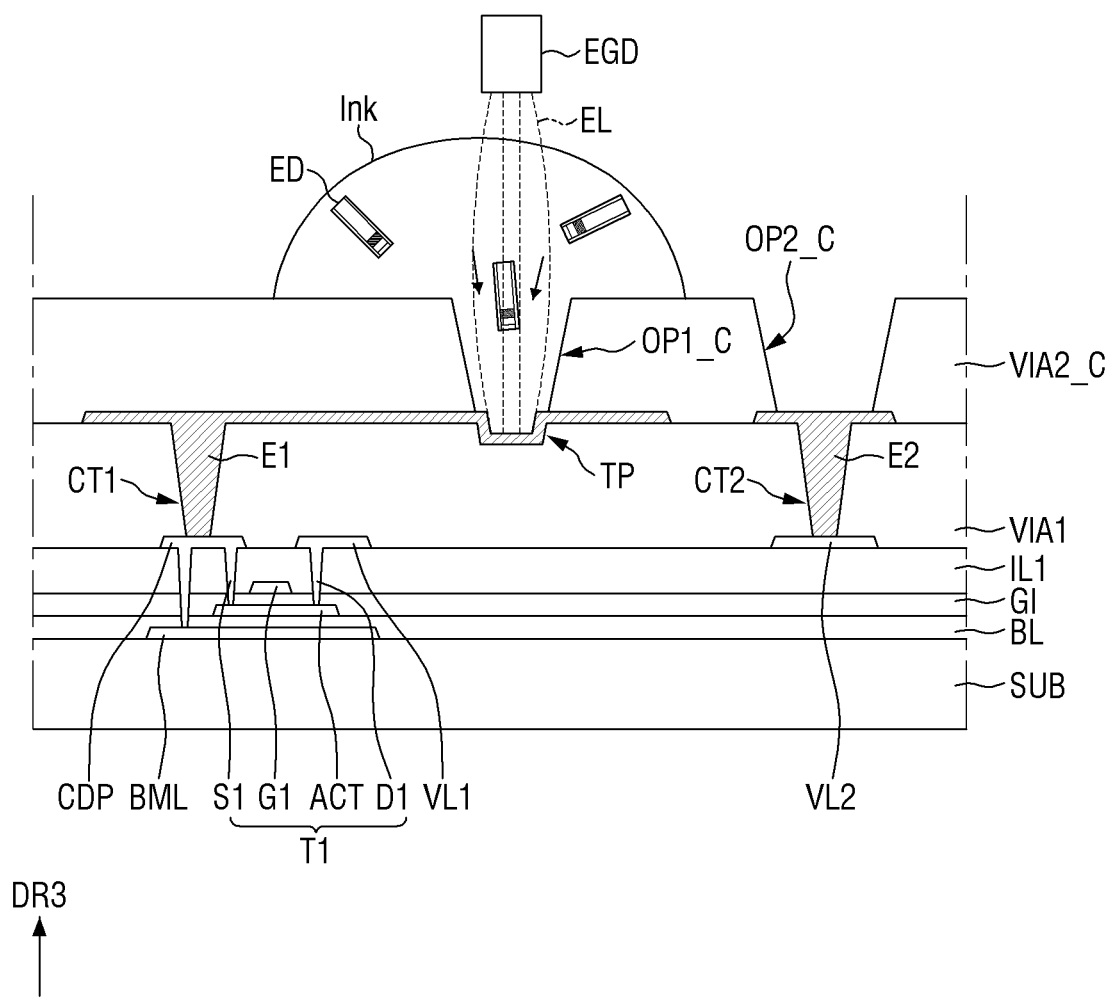

As an example, each of the light emitting elements ED may have a dipole by including semiconductor layers doped with different conductivity types, and positions and orientation directions of the light emitting elements ED may be changed by an electric field generated in the ink Ink. As illustrated in FIG. 13, in case that an external electric field generator EGD above the first sub openings OP1_C generates an electric field EL with the first electrode E1, the light emitting elements ED may receive a force by the electric field EL. As the positions and orientation directions of the light emitting elements ED dispersed in the ink Ink are changed by the electric field EL generated by the electric field generator EGD and the first electrode E1, the light emitting elements ED may be placed in the first sub openings OP1_C. For example, the light emitting elements ED may be placed such that specific or given ends, for example, first ends of the light emitting elements ED face the first electrode E1 according to the direction of the electric field EL.

Figure 14:
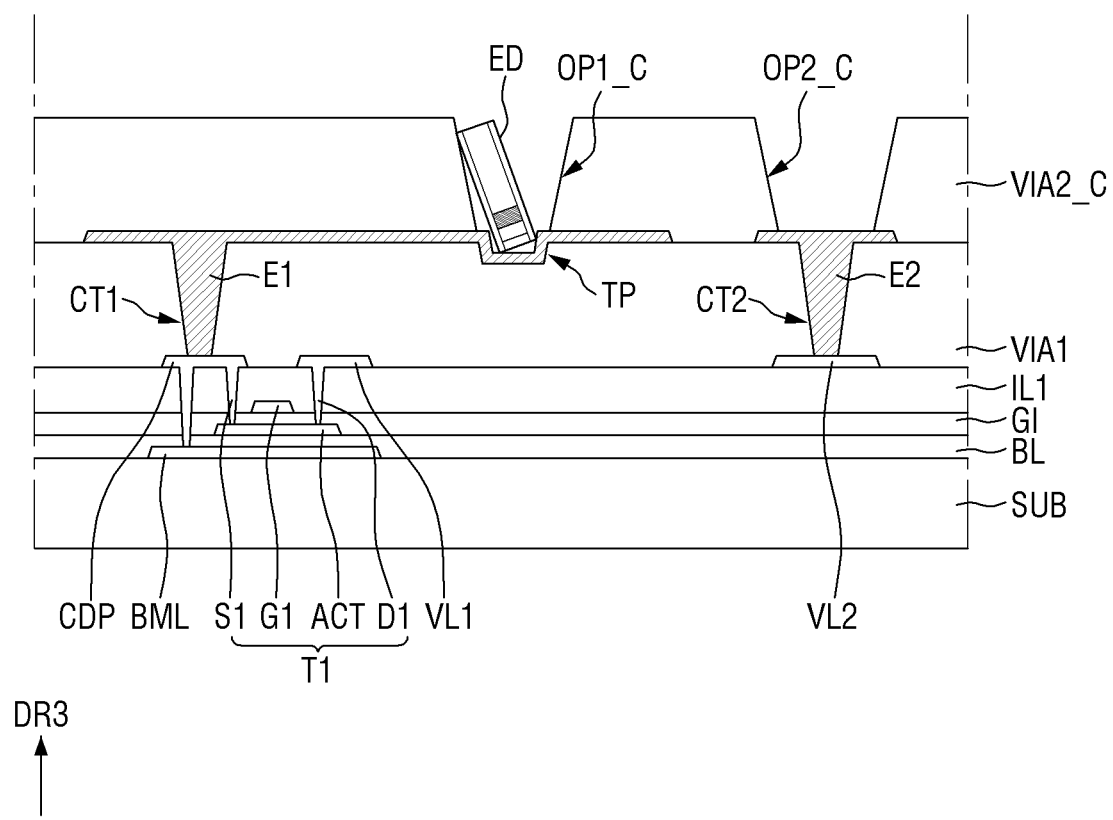

As illustrated in FIG. 14, in case that the light emitting elements ED are placed in the first sub openings OP1_C, the ink Ink is dried. In the drawings, only one first sub opening OP1_C is illustrated to show one light emitting element ED disposed in the first sub opening OP1_C. However, since a plurality of trench parts TP and a plurality of first openings OP1 are formed in each subpixel PXn as described above, a plurality of first sub openings OP1_C may be formed in the second sub via layer VIA2_C so that a plurality of light emitting elements ED may be disposed in the first sub openings OP1_C. As an example, a plurality of light emitting elements ED may be disposed in one first sub opening OP1_C.

Figure 15:
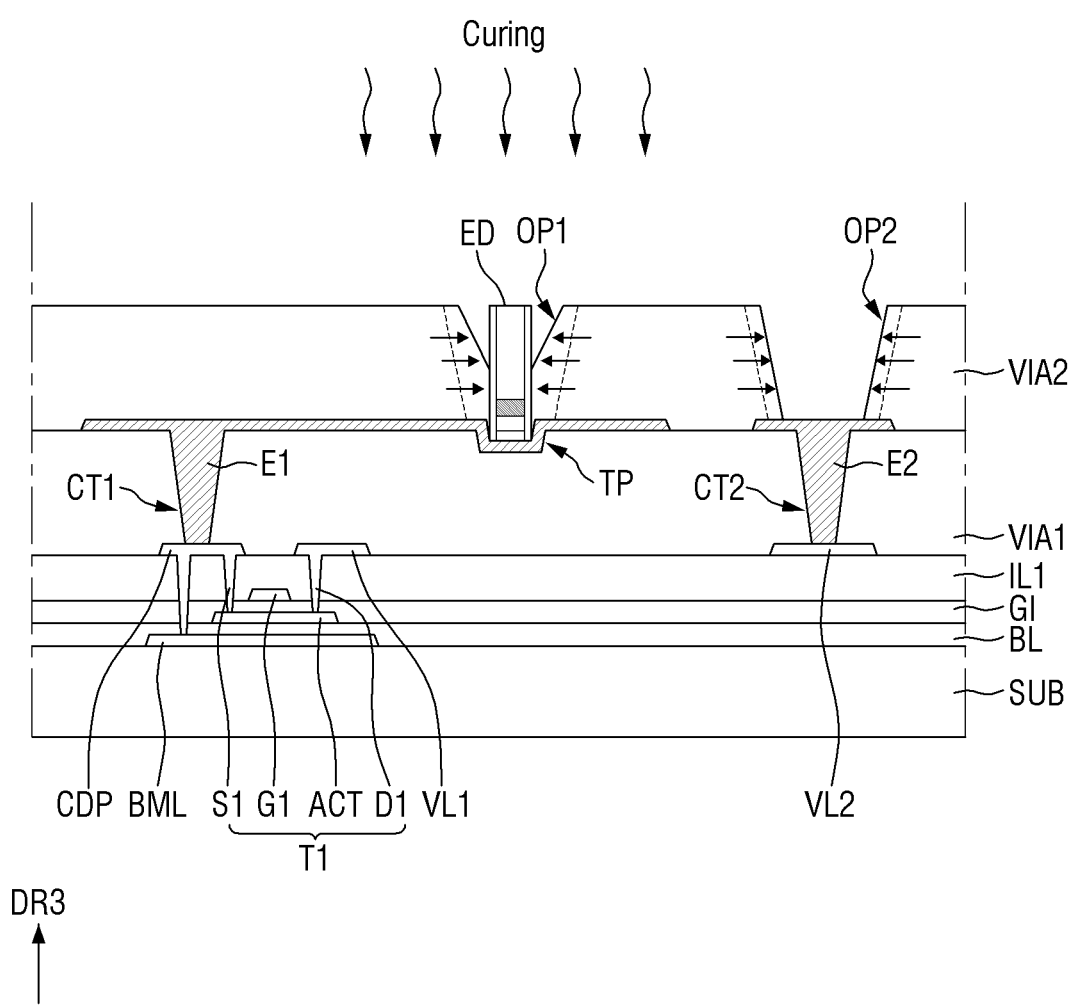

Referring to FIG. 15, the second via layer VIA2 may be formed by curing the second sub via layer VIA2_C through a heat treatment process. In case that the second sub via layer VIA2_C is heat-treated, the siloxane-based organic insulating material that forms the second sub via layer VIA2_C may reflow with fluidity, and the shape of the second sub via layer VIA2_C may be partially changed. For example, the organic insulating material may move so that spaces exposed by the first sub openings OP1_C and the second sub opening OP2_C become narrow. As the diameters of the first sub openings OP1_C are reduced, inner walls of the first sub openings OP1_C may contact the light emitting elements ED. As the organic insulating material is cured along with the movement of the organic insulating material, the light emitting elements ED may be fixed in a direction perpendicular to an upper surface of the first substrate SUB. The inner walls of the first openings OP1 formed by the curing of the material may partially contact the light emitting elements ED, and a maximum diameter WO1 of each first opening OP1 may be smaller than that of each first sub opening OP1_C.

Similarly, as the diameter of the second sub opening OP2_C is reduced, the width of the second sub opening OP2_C may be reduced to the same extent as the width of each first sub opening OP1_C. The second opening OP2 formed by the curing of the material may expose the second electrode E2, and a maximum diameter WO2 of the second opening OP2 may be smaller than that of the second sub opening OP2_C but greater than the maximum diameter WO1 of each first opening OP1.

Before the curing process for forming the second via layer VIA2 is performed, an initial curing process may be performed on the second sub via layer VIA2_C through heat treatment. Since the curing process for forming the second via layer VIA2 is a process of curing the second sub via layer VIA2_C which has not been completely cured, the degree of reflow of the organic insulating material can be controlled. However, the disclosure is not limited thereto, and the second via layer VIA2 may also be formed by performing a curing process, through one heat treatment process, on the uncured second sub via layer VIA2_C on which the initial curing process has not been performed. For example, in case that a large flow of organic insulating material is required so that the inner sidewalls contact outer surfaces of the light emitting elements ED as in the first openings OP1, only the curing process for forming the second via layer VIA2 may be performed. The initial curing process performed before the process of forming the second via layer VIA2 may be performed under optimized conditions according to the sizes of the first openings OP1 and the second opening OP2 and physical properties of the material.

Although not illustrated in the drawings, a third electrode E3 and a first insulating layer PAS1 may be formed on the second via layer VIA2 to produce the display device 10 according to an embodiment.

Various embodiments of the display device 10 will now be described with further reference to other drawings.

Figure 16:
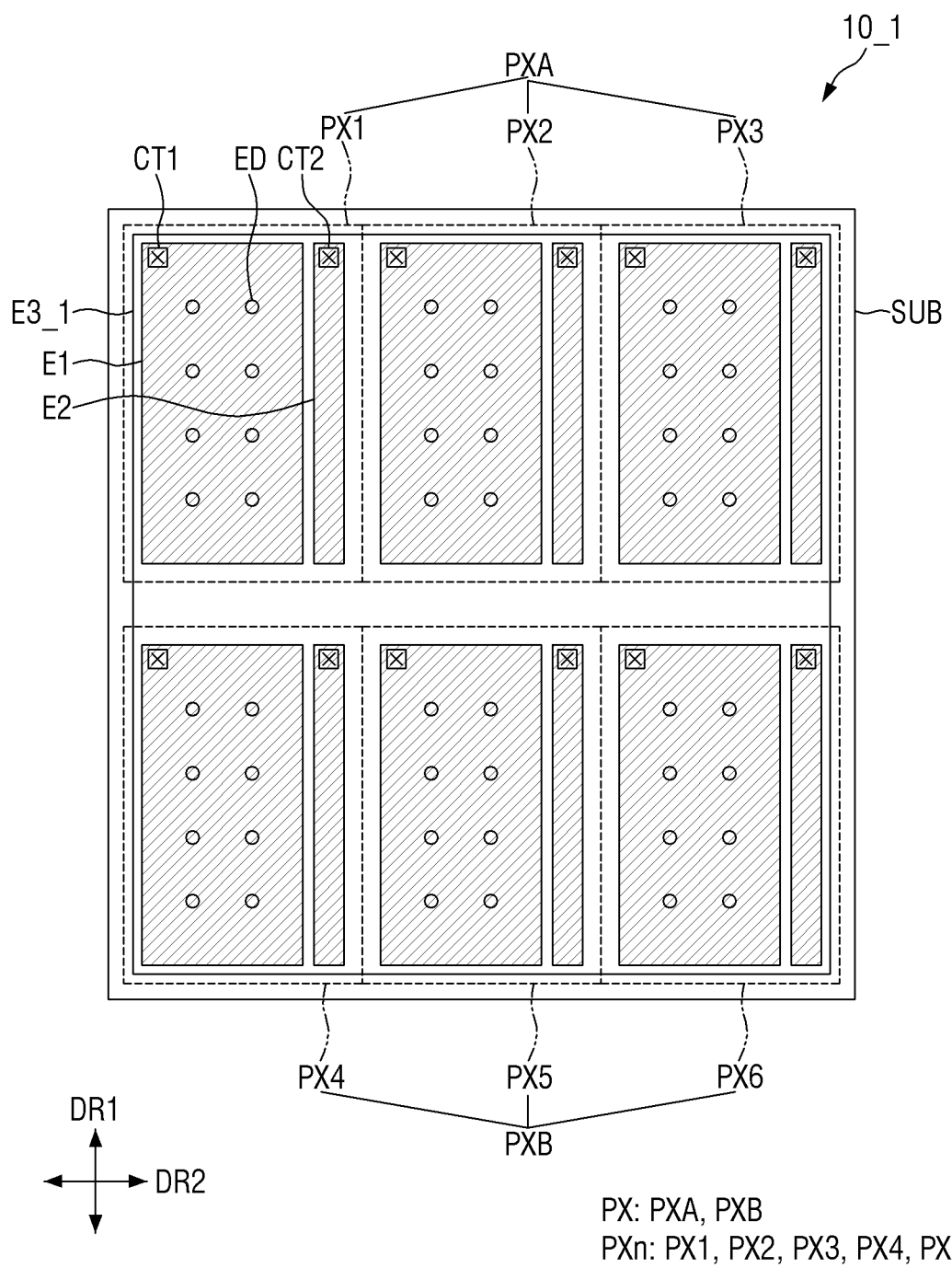
FIG. 16 is a schematic plan view of pixels of a display device according to an embodiment.

FIG. 16 is a schematic plan view of pixels of a display device 10_1 according to an embodiment.

Referring to FIG. 16, in the display device 10_1 according to an embodiment, a third electrode E3_1 may be disposed to cover or overlap one or more subpixels PXn or pixels PX. One third electrode E3_1 may be disposed over a plurality of subpixels PXn and may contact a second electrode E2 disposed in each subpixel PXn. The display device 10_1 of FIG. 16 may be different from the embodiment of FIG. 2 in the shape of the third electrode E3_1.

The third electrode E3_1 may extend in the first direction DR1 and the second direction DR2 beyond boundaries of neighboring or adjacent subpixels PXn. The area of the third electrode E3_1 in a plan view may be larger than that of one subpixel PXn, and the third electrode E3_1 may be disposed over other subpixels PXn. Although one third electrode E3_1 is disposed over a plurality of subpixels PXn or a first pixel PXA and a second pixel PXB in the drawing, the disclosure is not limited thereto, and the third electrode E3_1 may also cover or overlap all of the pixels PX over the entire display area DPA.

As described above, the third electrode E3 disposed in each subpixel PXn may be electrically connected to the second voltage wiring VL2 through the second electrode E2, and a same electrical signal may be transmitted to the third electrodes E3. In case that one integrated third electrode E3_1 is disposed in a plurality of subpixels PXn, a second power supply voltage may be applied simultaneously to a plurality of light emitting elements ED through a second voltage wiring VL2. However, since at least a first electrode E1 may be disposed separate for each subpixel PXn, the light emission of a corresponding subpixel PXn may be determined according to an electrical signal transmitted to the first electrode E1. In the display device 10_1 according to an embodiment, since one third electrode E3_1 is disposed to cover or overlap a plurality of subpixels PXn, a process of forming the third electrode E3_1 may be relatively simplified.

Figure 17:
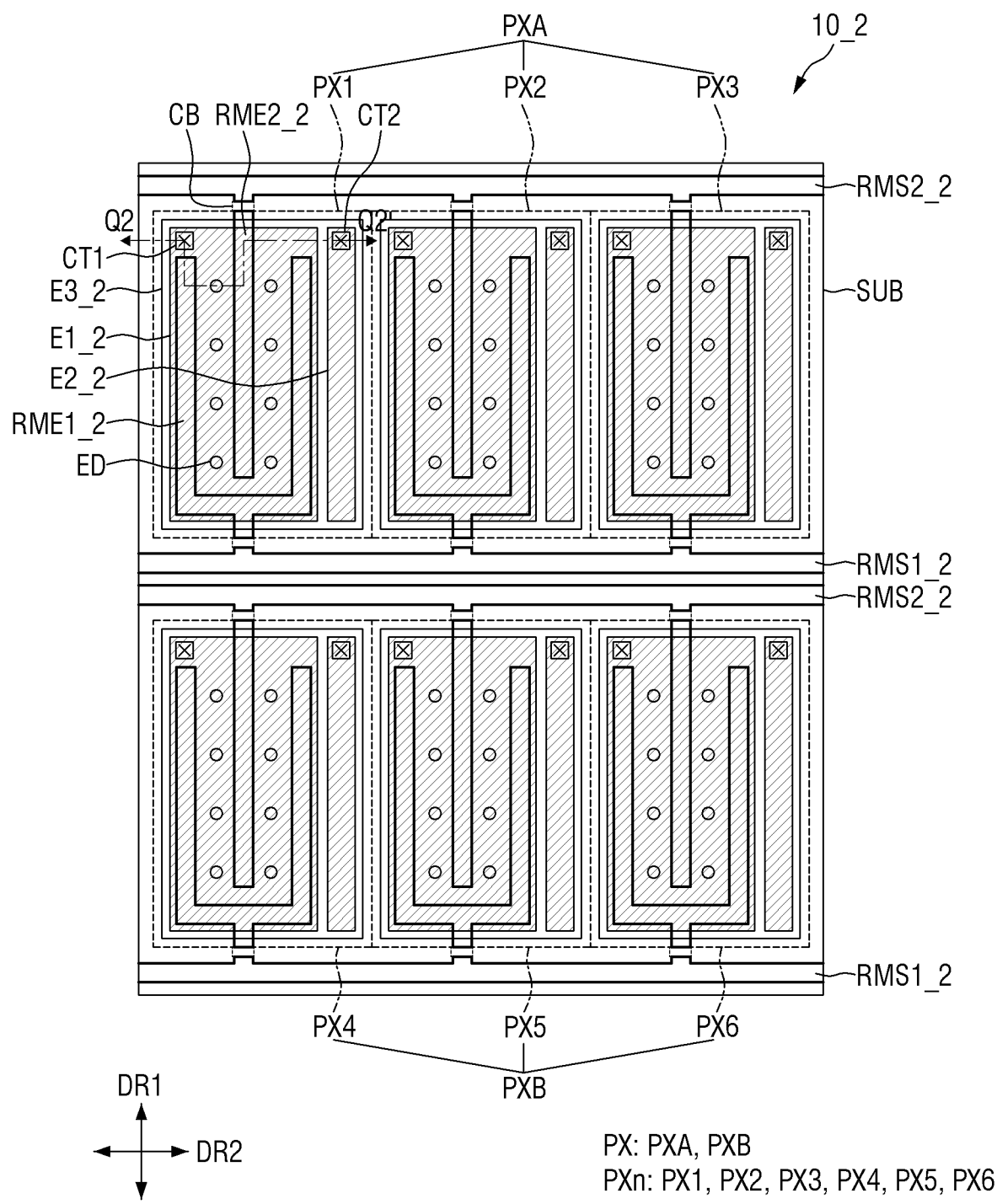
FIG. 17 is a schematic plan view of pixels of a display device according to an embodiment.
Figure 18:
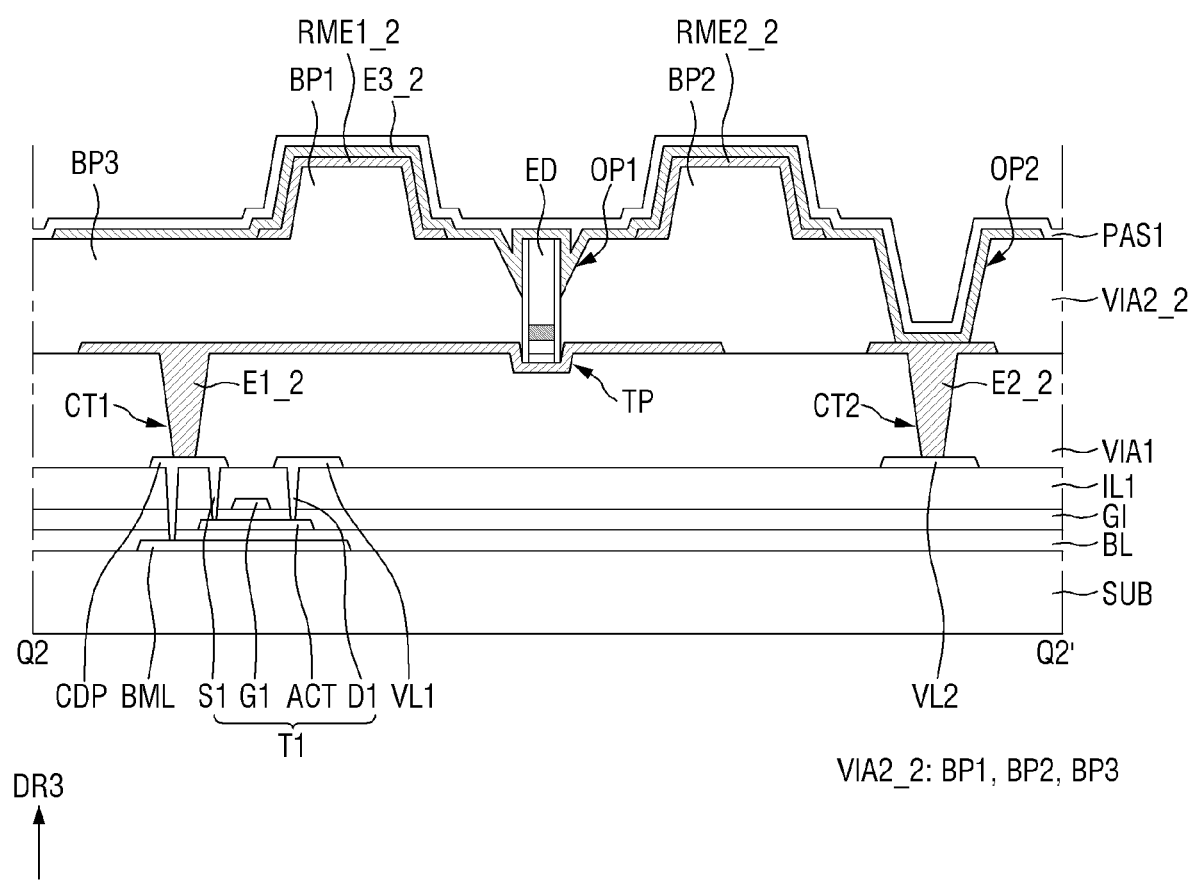
FIG. 18 is a schematic cross-sectional view taken along line Q2-Q2' of FIG. 17.
Figure 19:
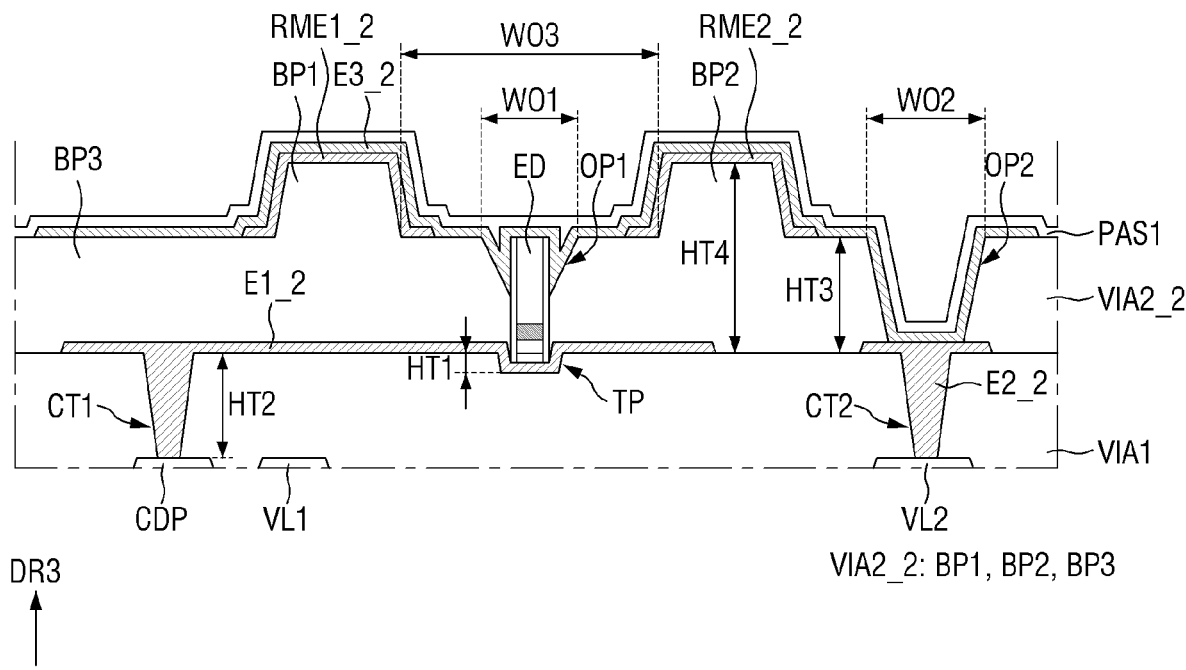
FIG. 19 is a schematic cross-sectional view illustrating a plurality of contact holes and a plurality of openings formed in a first via layer and a second via layer of FIG. 18.

FIG. 17 is a schematic plan view of pixels of a display device 10_2 according to an embodiment. FIG. 18 is a schematic cross-sectional view taken along line Q2-Q2' of FIG. 17. FIG. 19 is a schematic cross-sectional view illustrating a plurality of contact holes and a plurality of openings formed in a first via layer VIA1 and a second via layer VIA2_2 of FIG. 18.

Referring to FIGS. 17 through 19, in the display device 10_2 according to an embodiment, the second via layer VIA2_2 may further include bank parts BP1 and BP2 protruding from an upper surface of the second via layer VIA2_2 and may further include a plurality of sub electrodes RME1_2 and RME2_2 disposed on the bank parts BP1 and BP2 of the second via layer VIA2_2. The sub electrodes RME1_2 and RME2_2 disposed on the second via layer VIA2_2 may be utilized to generate an electric field in a process of placing light emitting elements ED.

The second via layer VIA2_2 may include a base part BP3 and the bank parts BP1 and BP2 protruding from parts of an upper surface of the base part BP3. In the second via layer VIA2_2, first openings OP1 and a second opening OP2 may be formed in the base part BP3 of each subpixel PXn, and the bank parts BP1 and BP2 may be spaced apart from each other with the first openings OP1 interposed between them.

The second via VIA2_2 may include a first bank part BP1 formed on a side of any one of the first openings OP1 and a second bank part BP2 spaced apart from the first bank part BP1 in the second direction DR2. The first bank part BP1 and the second bank part BP2 may extend in the first direction DR1 in each subpixel PXn in a plan view. The first bank part BP1 and the second bank part BP2 may be spaced apart from each other in the second direction DR2, and a plurality of first openings OP1 and a plurality of trench parts TP may be arranged or disposed between the first bank part OP1 and the second bank part BP2. According to an embodiment, a gap WO3 between the first bank part BP1 and the second bank part BP2 in the second direction DR2 may be greater than a maximum diameter WO1 of each of the first openings OP1. A plurality of light emitting elements ED may be disposed in a space between the first bank part BP1 and the second bank part BP2 spaced apart from each other in the second direction DR2.

Although one first bank part BP1 and one second bank part BP2 are illustrated in the drawings, another first bank BP1 may be further disposed on a side of the second bank part BP2 in the second direction DR2. As illustrated in FIG. 17, in case that the light emitting elements ED are arranged or disposed in one column in the first direction DR1 and arranged or disposed in another column spaced apart from the column in the second direction DR2, the second bank part BP2 may be disposed in the center of each subpixel PXn, and the first bank parts BP1 may be disposed on both sides of the second bank part BP2 in the second direction DR2. Lengths of the first bank part BP1 and the second bank part BP2 in the first direction DR1 may be smaller than a length of a first electrode E1_2 in the first direction DR1. The first bank part BP1 and the second bank part BP2 may be formed adjacent in the second direction DR2 to a part where the first openings OP1 in which the light emitting elements ED are disposed are formed and may not be formed near both sides of the first electrode E1_2 in the first direction DR1. However, the disclosure is not limited thereto, and the first bank part BP1 and the second bank part BP2 may also extend in the first direction DR1 over a plurality of subpixels PXn and may be disposed as linear patterns in the entire display area DPA.

The base part BP3 may be a part of the second via layer VIA2_2 on which the first bank part BP1 and the second bank part BP2 may not be formed and may be a part having a relatively flat upper surface. The first openings OP1 and a second opening OP2 may be formed in the base part BP3. The first bank part BP1 and the second bank part BP2 may protrude upward from the upper surface of the base part BP3. The protruding first and second bank parts BP1 and BP2 may have substantially inclined or substantially curved side surfaces. In an embodiment, a thickness HT4 of a part of the second via layer VIA2_2 on which the first bank part BP1 and the second bank part BP2 are located or disposed may be greater than a thickness 1-T3 of the base part BP3. The thickness HT4 of the part of the second via layer VIA2_2 on which the first bank part BP1 and the second bank part BP2 may be located or disposed may be greater than a length of each light emitting element ED, and the thickness HT3 of the base part BP3 may be smaller than the length of each light emitting element ED. Since upper surfaces of the first bank part BP1 and the second bank part BP2 may be higher than the upper surface of the base part BP3, a valley part may be formed between the first bank part BP1 and the second bank part BP2. In a process of manufacturing the display device 10_2, ink may be sprayed to the valley part between the first bank part BP1 and the second bank part BP2, and the light emitting elements ED may be smoothly placed in the first openings OP1.

The sub electrodes RME1_2 and RME2_2 may be disposed on the first bank part BP1 and the second bank part BP2, respectively. A first sub electrode RME1_2 may include parts disposed on a plurality of first bank parts BP1 and extending in the first direction DR1 and a part connecting the parts and extending in the second direction DR2. The second sub electrode RME2_2 may be disposed on the second bank part BP2 and may extend in the first direction DR1. The parts of the first sub electrode RME1_2 which extend in the first direction DR1 may be spaced apart from the second sub electrode RME2_2 in the second direction DR2, and the part of the first sub electrode RME1_2 which extends in the second direction DR2 may be spaced apart from the second sub electrode RME2_2 in the first direction DR1. The first sub electrode RME1_2 may generally surround the second sub electrode RME2_2 in a plan view.

The first sub electrode RME1_2 and the second sub electrode RME2_2 may have a greater width than the first bank part BP1 and the second bank part BP2, respectively, and may also be disposed on the inclined side surfaces of the first bank part BP1 and the second bank part BP2. At least a part of light emitted from the light emitting elements ED disposed in the first openings OP1 may travel toward the inclined side surfaces of the first bank part BP1 and the second bank part BP2. In an embodiment, the first sub electrode RME1_2 and the second sub electrode RME2_2 may include a material having high reflectivity, and the light traveling toward the inclined side surfaces of the first bank part OP1 and the second bank part BP2 may be reflected upward by the sub electrodes RME1_2 and RME2_2.

A gap between the sub electrodes RME1_2 and RME2_2 in the second direction DR2 may be smaller than a gap between the first bank part BP1 and the second bank part BP2. At least a part of each of the sub electrodes RME1_2 and RME2_2 may be disposed on or directly disposed on the base part BP3 of the second via layer VIA2_2. Thus, the sub electrodes RME1_2 and RME2_2 may lie in a same plane, or may be coplanar.

A third electrode E3_2 may be disposed on the second via layer VIA2_2 and may cover or overlap the sub electrodes RME1_2 and RME2_2. In an embodiment, the third electrode E3_2 may contact or directly contact the sub electrodes RME1_2 and RME2_2, and the sub electrodes RME1_2 and RME2_2 may be electrically connected to a second electrode E2_2 and a second voltage wiring VL2 through the third electrode E3_2.

According to an embodiment, the display device 10_2 may further include a plurality of electrode lines RMS1_2 and RMS2_2 extending in the second direction DR2 and disposed at boundaries of subpixels PXn neighboring in the first direction DR1. The electrode lines RMS1_2 and RMS2_2 may include a first electrode line RMS1_2 spaced apart from the first sub electrode RME1_2 of each subpixel PXn in the first direction DR1 and a second electrode line RMS2_2 spaced apart from the second sub electrode RME2_2 of each subpixel PXn in the first direction DR1. The first electrode line RMS1_2 and the second electrode line RMS2_2 may extend in the second direction DR2 across a plurality of subpixels PXn. The first electrode line RMS1_2 may be disposed on a lower side of a corresponding subpixel PXn which is a side of the first direction DR1, and the second electrode line RMS2_2 may be disposed on an upper side of a corresponding subpixel PXn which is the other side of the first direction DR1. The first electrode line RMS1_2 and the second electrode line RMS2_2 may be spaced apart from each other in the first direction DR1 and may be alternately arranged or disposed along the first direction DR1. The first and second electrodes E1_2 and E2_2 of the subpixels PXn may be disposed between one first electrode line RMS1_2 and the second electrode line RMS2_2 not adjacent to and spaced apart from the first electrode line RMS1_2 in the first direction DR1. Other members may not be disposed between the first electrode line RMS1_2 and the second electrode line RMS2_2 disposed adjacent to and spaced apart from each other.

As described above, the first sub electrode RME1_2 and the second sub electrode RME2_2 may be utilized to generate an electric field for placing the light emitting elements ED during the process of manufacturing the display device 10_2. The first electrode line RMS1_2 and the second electrode line RMS2_2 may be respectively electrically connected to the first sub electrode RME1_2 and the second sub electrode RME2_2 to transmit electrical signals for generating an electric field and may be separated from the sub electrodes RME1_2 and RME2_2 in a separation part CB after the placement of the light emitting elements ED. For example, the first electrode line RMS1_2 and the second electrode line RMS2_2 may be wirings that are utilized to transmit electrical signals during the manufacturing process and are disconnected.

The display device 10_2 according to the current embodiment may be different from the embodiment of FIGS. 2 and 3 in that the second via layer VIA2_2 further may include the first bankpart BP1 and the second bank part BP2, and the sub electrodes RME1_2 and RME2_2 may be further included. Since the display device 10_2 further may include members utilized to generate an electric field or capable of reflecting light emitted from the light emitting elements ED, the process of placing the light emitting elements ED becomes simplified, and upward luminous efficiency can be further improved.

FIGS. 20 through 24 are schematic cross-sectional views sequentially illustrating operations in a process of manufacturing the display device 10_2 of FIG. 18. FIGS. 20 through 24 schematically illustrate a process of forming each layer of the display device 10_2. The order of forming each layer will be described in detail below, and the process or method of forming each layer will be described.

Figure 20:
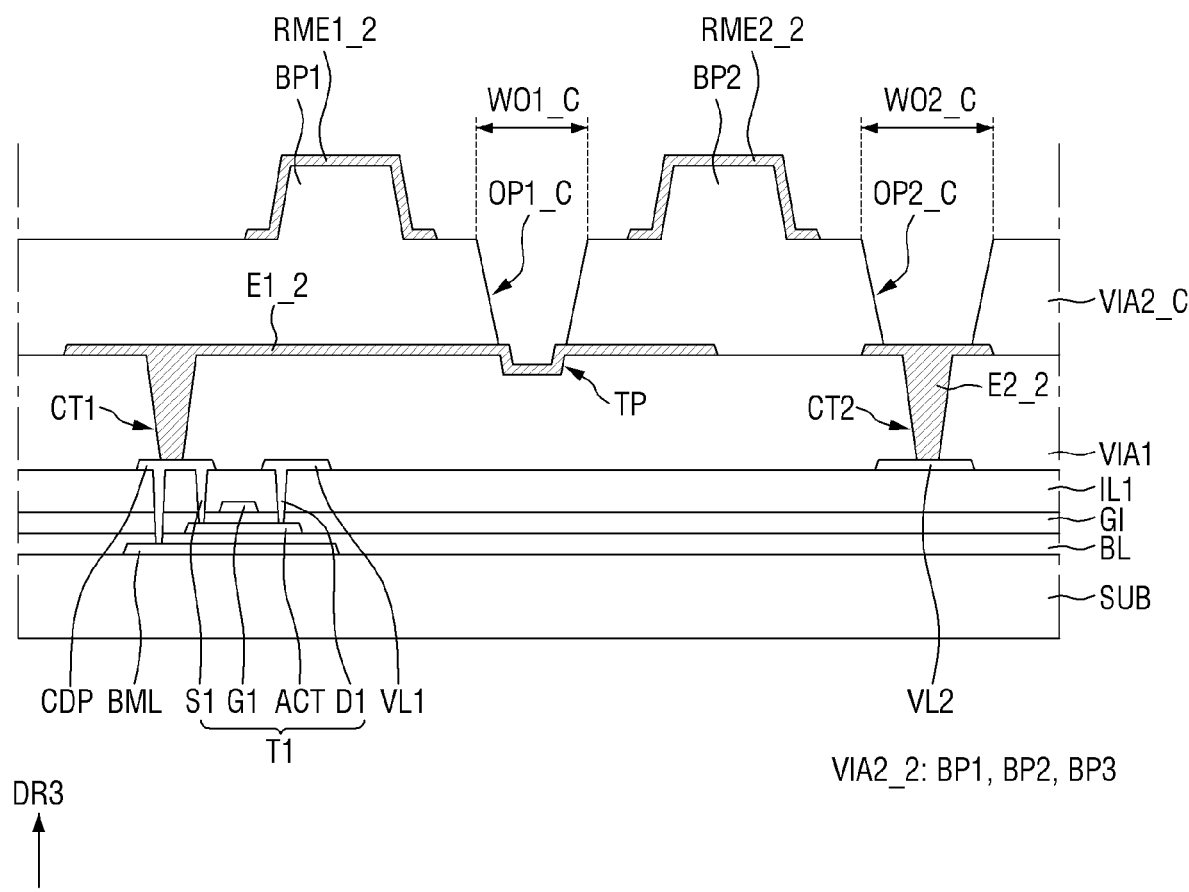
FIGS. 20 through 24 are schematic cross-sectional views sequentially illustrating operations in a process of manufacturing the display device of FIG. 18.

First, referring to FIG. 20, a semiconductor layer, a buffer layer BL, a first conductive layer, a first gate insulting layer GI, a second conductive layer, a first interlayer insulating layer IL1, a third conductive layer, a first via layer VIA1, a first electrode E1_2, a second electrode E2_2, a second sub via layer VIA2_C, and a plurality of sub electrodes RME1_2 and RME2_2 may be formed on a first substrate SUB. In the first via layer VIA1, a plurality of trench parts TP and a plurality of contact holes CT1 and CT2 may be formed as described above. The second sub via layer VIA2_C may include a base part BP3 in which first sub openings OP1_C and a second sub opening OP2_C are formed and a first bank part BP1 and a second bank part BP2 which protrude from an upper surface of the base part BP3. The sub electrodes RME1_2 and RME2_2 may be formed on the first bank part BP1 and the second bank part BP2, respectively.

Light emitting elements ED are placed in the first sub openings OP1_C.

Figure 21:
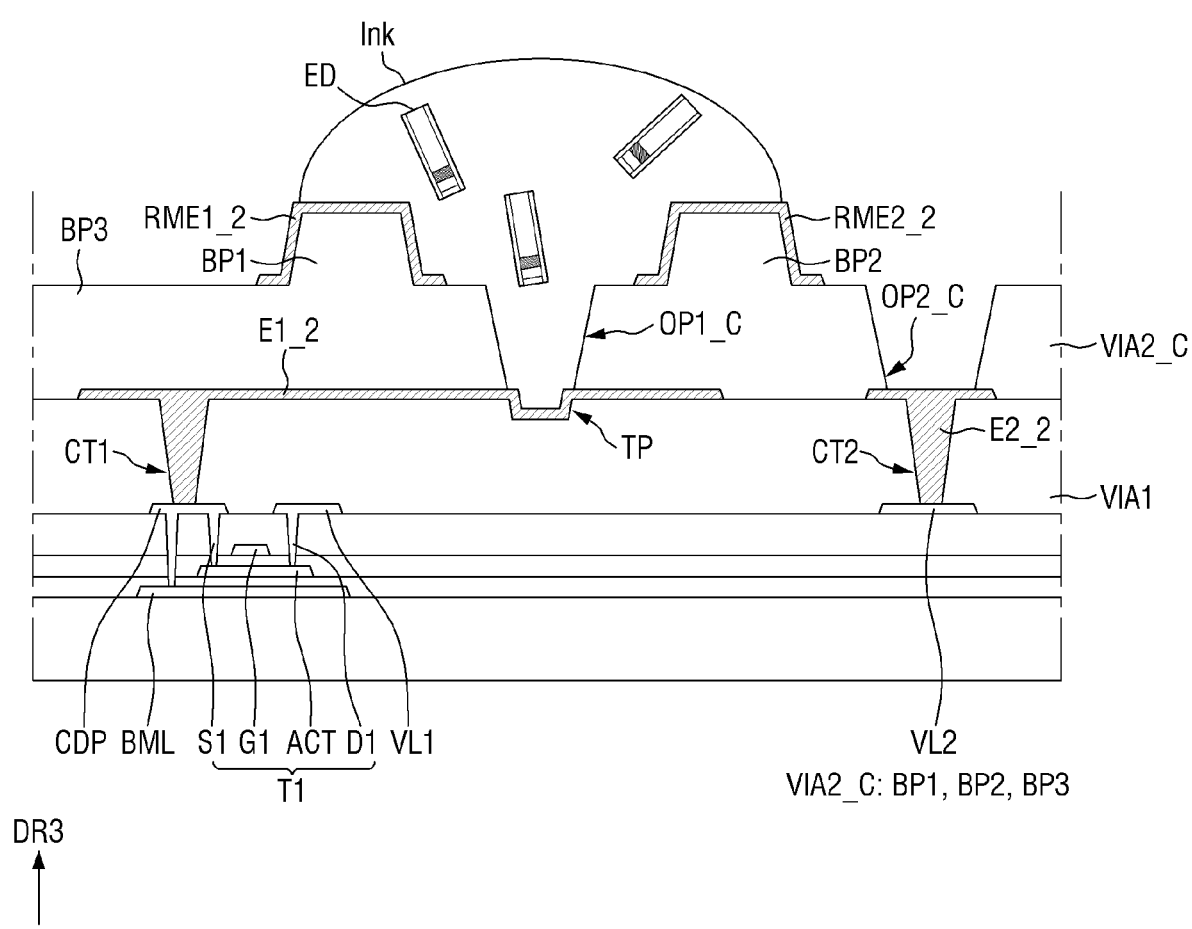

Referring to FIG. 21, the light emitting elements ED may be prepared in a state where they are dispersed in ink Ink and may be sprayed to each subpixel PXn through an inkjet printing process. The ink Ink may be sprayed between the first bank part BP1 and the second bank part BP2 of the second sub via layer VIA2_C or onto the first sub openings OP1_C.

Figure 22:
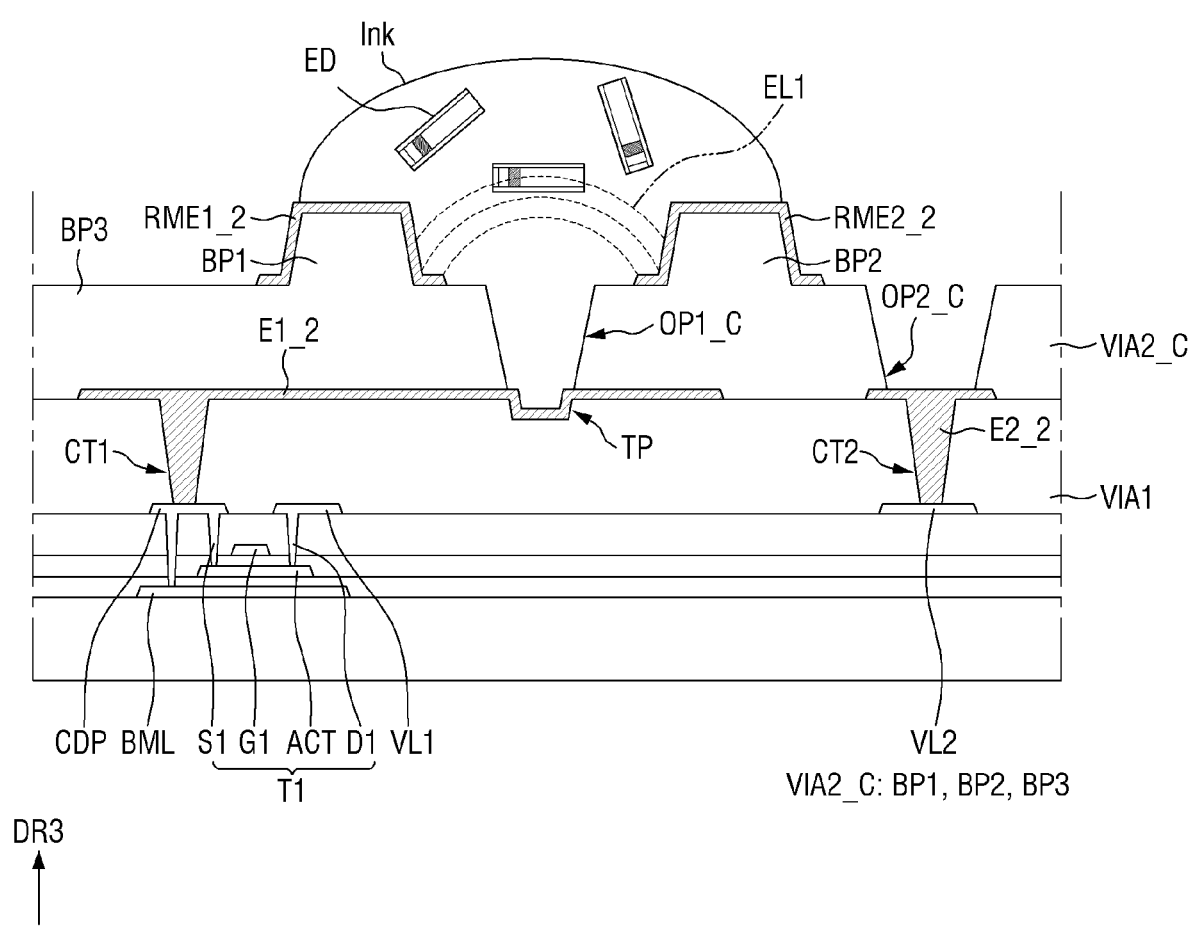

Referring to FIG. 22, a first electric field EL1 is generated between the first sub electrode RME1_2 and the second sub electrode RME2_2 by transmitting electrical signals to the first sub electrode RME1_2 and the second sub electrode RME2_2. The first sub electrode RME1_2 and the second sub electrode RME2_2 may be spaced apart in the second direction DR2 to face each other, and the first electric field EL1 may face a direction parallel to an upper surface of the first substrate SUB. The light emitting elements ED in the ink ink may be oriented in a horizontal direction by the first electric field EL1.

Figure 23:
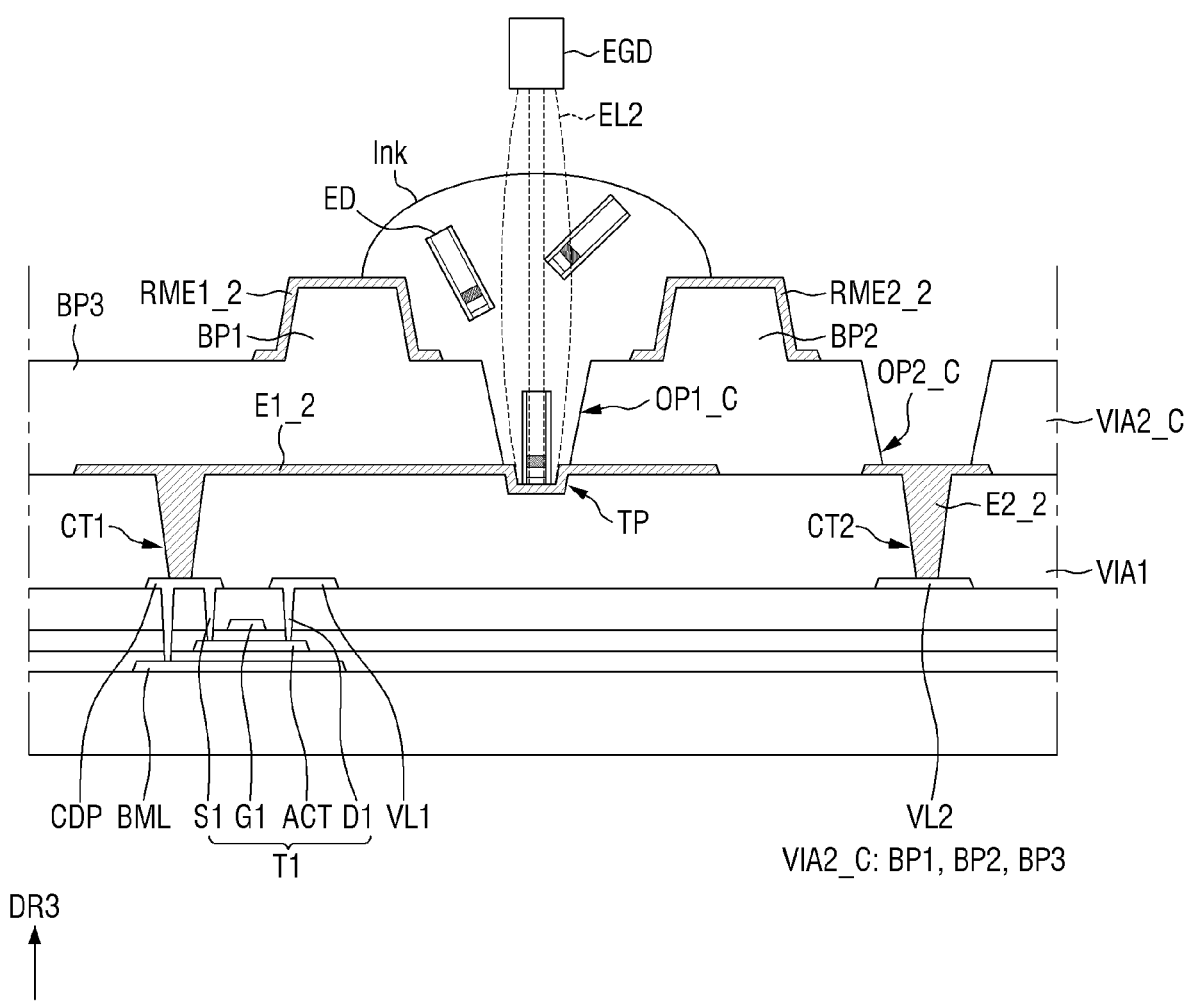

Referring to FIG. 23, a second electric field EL2 is generated using an external electric field generator EGD and the first electrode E1_2. The second electric field EL2 may face a direction perpendicular to the upper surface of the first substrate SUB, and the light emitting elements ED may be oriented in a vertical direction by the second electric field EL2 in the ink Ink. The light emitting elements ED dispersed randomly in the ink Ink may be placed in the first sub openings OP1_C as their positions and orientation directions are changed by the first electric field EL1 and the second electric field EL2. Compared with the embodiment of FIGS. 12 and 13, in the current embodiment, the light emitting elements ED may be initially oriented by generating the first electric field EL1 in the horizontal direction before moving the light emitting elements ED into the first sub openings OP1_C. In case that the light emitting elements ED are oriented in a direction, they may be more readily moved into the first sub openings OP1_C through generation of the second electric field EL2 than in case that the light emitting elements ED are dispersed randomly in the ink Ink.

Figure 24:
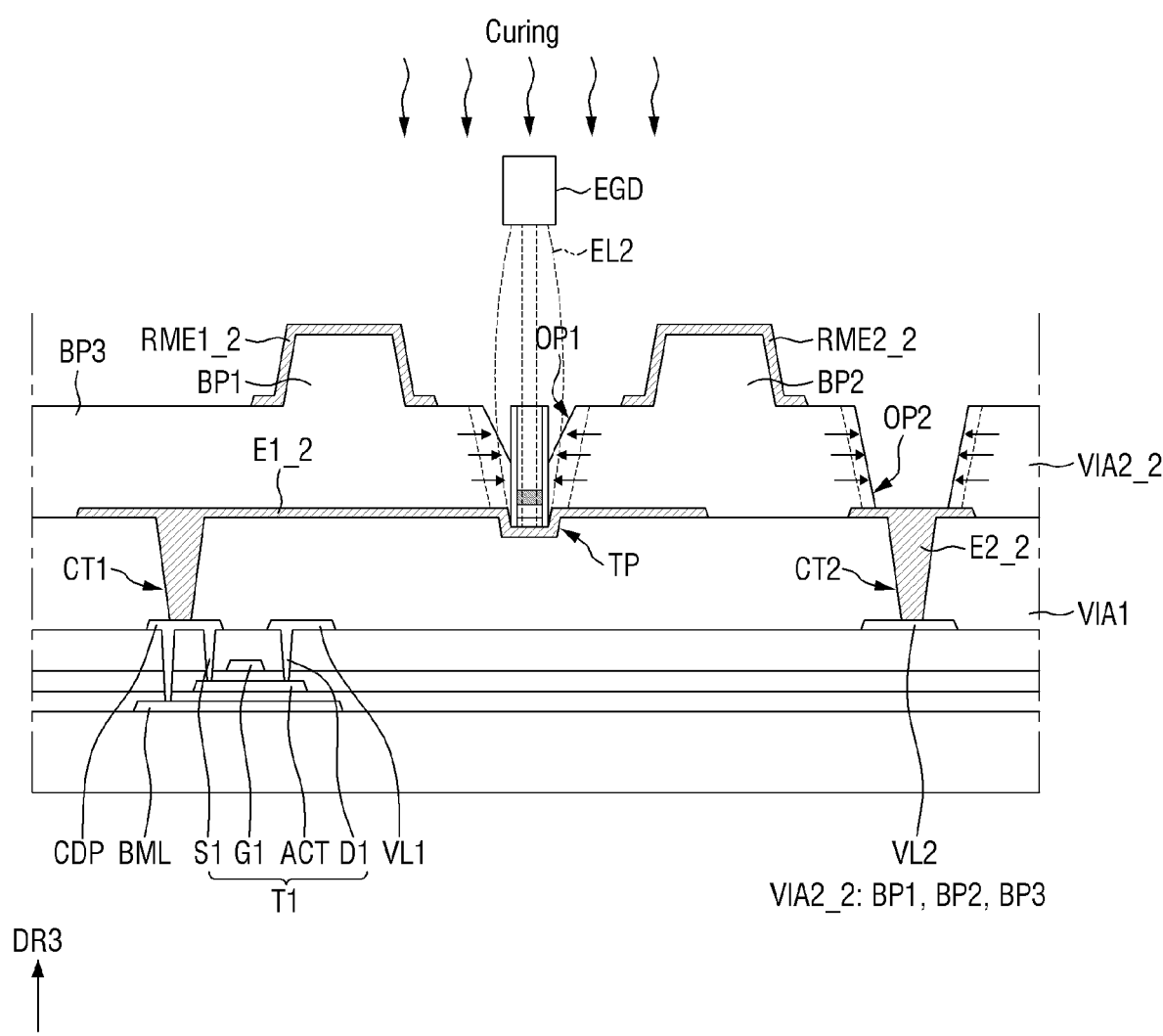

Referring to FIG. 24, a second via layer VIA2_2 is formed by curing the second sub via layer VIA2_C through a heat treatment process. In case that the second sub via layer VIA2_C is heat-treated, a siloxane-based organic insulating material that forms the second sub via layer VIA2_C may reflow with fluidity, and the shape of the second sub via layer VIA2_C may be partially changed. As described above, respective diameters of the first sub openings OP1_C and the second sub opening OP2_C may be reduced in the current process. As a result, first openings OP1 and a second opening OP2 may be formed.

According to an embodiment, a curing process for forming the second via layer VIA2_2 may be performed in a state where the external electric field generator EGD and the first electrode E1_2 have generated the second electric field EL2. In case that the curing process is performed in a state where the second electric field EL2 has been generated, the organic insulating material may flow while the orientation of the light emitting elements ED is fixed. In this process, the light emitting elements ED can be more readily oriented in the vertical direction than in case that the light emitting elements ED are fixed in the vertical direction by the flow of the organic insulating material.

Although not illustrated in the drawings, a third electrode E3_2 and a first insulating layer PAS1 may be formed on the second via layer VIA2_2 to produce the display device 10_2 according to an embodiment.

Figure 25:
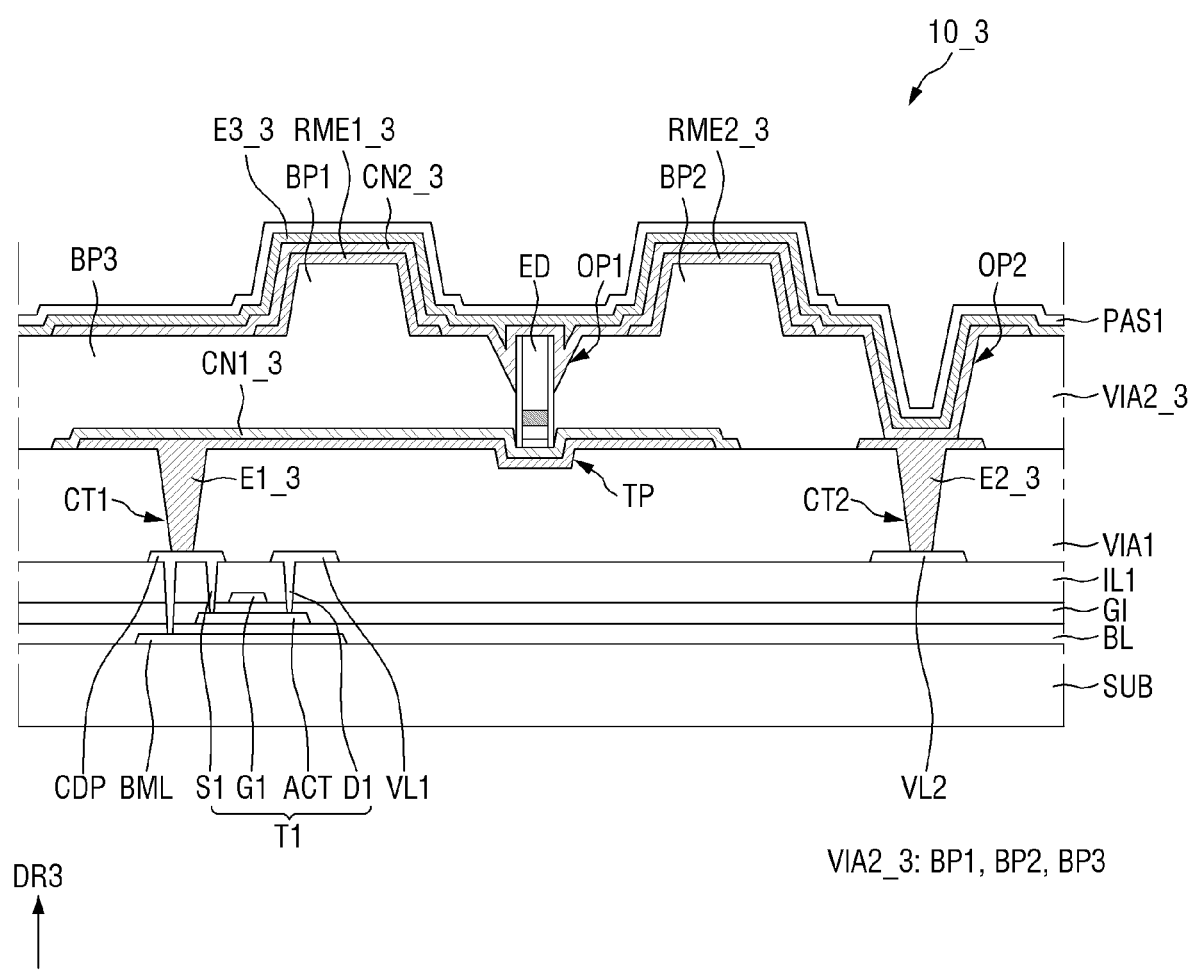
FIG. 25 is a schematic cross-sectional view of a subpixel of a display device according to an embodiment.

FIG. 25 is a schematic cross-sectional view of a subpixel of a display device 10_3 according to an embodiment.

Referring to FIG. 25, the display device 10_3 according to an embodiment may further include a plurality of connection electrodes CN1_3 and CN2_3. Each of the connection electrodes CN1_3 and CN2_3 may be disposed between a first electrode E1_3 and light emitting elements ED or between a third electrode E3_3 and the light emitting elements ED. The connection electrodes CN1_3 and CN2_3 may include a different material from the first electrode E1_3 and the third electrode E3_3 to reduce contact resistance with the light emitting elements ED. The display device 10_3 of FIG. 25 may be different from the embodiment of FIG. 18 in that it further may include the connection electrodes CN1_3 and CN2_3.

A first connection electrode CN1_3 may be disposed on the first electrode E1_3. The first connection electrode CN1_3 may be disposed in substantially a same shape as the first electrode E1_3 but may cover or overlap the first electrode E1_3 because the area of the first connection electrode CN1_3 in a plan view is larger than that of the first electrode E1_3. The first connection electrode CN1_3 may also be disposed on trench parts TP, and first ends of the light emitting elements ED may contact or directly contact the first connection electrode CN1_3, The first connection electrode CN1_3 may contact the first ends of the light emitting elements ED and the first electrode E1_3, and the light emitting elements ED may be electrically connected to the first electrode E1_3 through the first connection electrode CN1_3. However, the first connection electrode CN1_3 may not necessarily be disposed to cover or overlap the first electrode E1_3. In an embodiment, the first connection electrode CN1_3 may be disposed only on a part of the first electrode E1_3 which covers or overlaps the trench parts TP to correspond to the trench parts TP in which the light emitting elements ED are disposed.

A second connection electrode CN2_3 may be disposed on a second via layer VIA2_3 and a plurality of sub electrodes RME1_3 and RME2_3. The second connection electrode CN2_3 may be disposed in substantially a same shape as the third electrode E3_3, but the area of the second connection electrode CN2_3 in a plan view may be smaller than that of the third electrode E3_3, and the third electrode E3_3 may cover or overlap the second connection electrode CN2_3. The second connection electrode CN2_3 may be disposed on first openings OP1 and a second opening OP2 and may contact or directly contact second ends of the light emitting elements ED and a second electrode E2_3. The light emitting elements ED may be electrically connected to the third electrode E3_3 and the second electrode E2_3 through the second connection electrode CN2_3.

The connection electrodes CN1_3 and CN2_3 may include a conductive material such as ITO, IZO, ITZO, or aluminum (Al). For example, the connection electrodes CN1_3 and CN2_3 may include a transparent conductive material, and light emitted from the light emitting elements ED may pass through the connection electrodes CN1_3 and CN2_3 and may be reflected by the first electrode E1_3 or may pass through the third electrode E3_3 to travel upward above the first substrate SUB. Since the connection electrodes CN1_3 and CN2_3 can reduce the contact resistance with the light emitting elements ED by including a different material from the first electrode E1_3 or the third electrode E3_3, luminous efficiency can be further improved.

In the above embodiments, a case where the light emitting elements ED are placed perpendicular to the upper surface of the first substrate SUB has been described. However, in the process of manufacturing the display device 10, the light emitting elements ED may be erected or disposed in the process of curing an organic insulating material for forming the second via layer VIA2. In this process, the light emitting elements ED may not necessarily be placed perpendicular to the upper surface of the first substrate SUR but may also be inclined at a specific or given angle.

Figure 26:
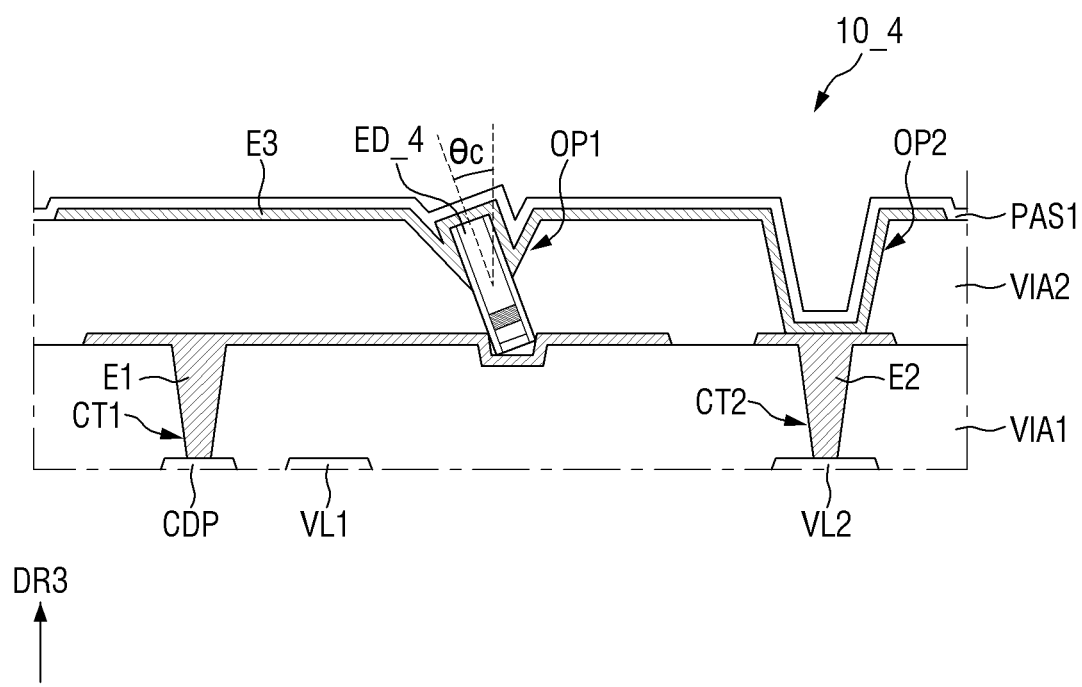
FIG. 26 is a schematic cross-sectional view of a subpixel of a display device according to an embodiment.

FIG. 26 is a schematic cross-sectional view of a subpixel of a display device 10_4 according to an embodiment.

Referring to FIG. 26, in the display device 10_4 according to an embodiment, light emitting elements ED_4 may be disposed to face a direction not parallel to an upper surface of a first substrate SUB. The light emitting elements ED_4 may generally be erected or disposed on the first substrate SUB but may be disposed in a direction perpendicular to and at least not parallel to the upper surface of the first substrate SUB or a direction inclined from the direction.

According to an embodiment, in the display device 10_4, the light emitting elements ED_4 may be inclined at a first angle or an angle θc from the direction perpendicular to the upper surface of the first substrate SUB, and the first angle or an angle θc may be adjusted according to conditions of a curing process in a process of forming a second via layer VIA2. For example, the first angle or an angle θc may be an acute angle of about 60 degrees or less, for example, in a range of about 0 degrees to about 60 degrees in consideration of a viewing angle of the display device 10_4. Although the light emitting elements ED_4 are inclined to a side in the drawing, since first openings OP1 are circular in a plan view, a direction in which the light emitting elements ED 4 are inclined is not particularly limited. The first angle or angle θc calculated according to the direction in which the light emitting elements ED_4 are inclined may be defined as an acute angle measured from the direction perpendicular to the upper surface of the first substrate SUB.

In case that an organic insulating material for forming the second via layer VIA2 is cured, if the widths of sub openings are uniformly reduced by appropriately controlling the process conditions, the light emitting elements ED may be vertically erected or disposed. However, the light emitting elements ED may not necessarily be vertically erected or disposed but may be inclined due to an error in the process conditions or according to the initial orientation of the light emitting elements ED 4. However, the light emitting elements ED_4 may be disposed in a direction not parallel to the upper surface of the first substrate SUB and may be disposed such that at least the first angle Dc or an angle has an acute angle of about 60 degrees or less in consideration of the viewing angle of the display device 10_4.

In a display device according to an embodiment, light emitting elements extending in a direction may be upright or disposed on a substrate. Light emitted through both ends of the light emitting elements and light emitted through side surfaces of the light emitting elements may smoothly travel upward above the substrate, and the display device may have excellent luminous efficiency.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
  a first via layer disposed on a substrate and comprising trench parts recessed from an upper surface of the first via layer;
  a first electrode and a second electrode that are disposed on the first via layer and spaced apart from each other;
  a second via layer disposed on the first via layer and comprising:
    first openings partially exposing the first electrode; and
    a second opening partially exposing the second electrode;
  light emitting elements disposed in the first openings of the second via layer and extending in a direction; and
  a third electrode disposed on the second via layer, wherein each of the light emitting elements includes:
    a first end electrically connected to the first electrode; and
    a second end electrically connected to the third electrode, and
  each of the light emitting elements is disposed such that the extending direction of the light emitting elements is not parallel to an upper surface of the substrate.

2. The display device of claim 1, wherein an angle formed by the extending direction of the light emitting elements and a direction perpendicular to the upper surface of the substrate is in a range of about 0 degrees to about 60 degrees.

3. The display device of claim 1, wherein the first openings overlap the trench parts in a thickness direction.

4. The display device of claim 3, wherein
  a diameter of each of the first openings is reduced from an upper surface of the second via layer toward a bottom surface of the second via layer, and
  a maximum diameter of each of the first openings is smaller than a maximum diameter of the second opening of the second via layer.

5. The display device of claim 4, wherein
  a part of inner walls of each of the first openings directly contacts a part of an outer surface of a light emitting element, and
  the second via layer surrounds a part of each of the light emitting elements.

6. The display device of claim 1, further comprising:
  a conductive layer disposed between the first via layer and the substrate, wherein
  the first via layer further comprises contact holes penetrating the first via layer and partially exposing the conductive layer, and
  a first depth of each of the trench parts is smaller than a second depth of each of the contact holes.

7. The display device of claim 6, wherein
  each of the first depth of each of the trench parts and a thickness of the second via layer is smaller than a length of each light emitting element in the extending direction, and
  the first ends of the light emitting elements are inserted into the trench parts.

8. The display device of claim 1, wherein the third electrode directly contacts the second electrode exposed through the second opening of the second via layer.

9. The display device of claim 8, wherein
  the first electrode directly contacts the first ends of the light emitting elements, and
  the third electrode directly contacts the second ends of the light emitting elements.

10. The display device of claim 8, further comprising:
  a first connection electrode disposed on the first electrode; and
  a second connection electrode disposed between the third electrode and the second via layer, wherein
  the first connection electrode directly contacts the first ends of the light emitting elements and the first electrode, and
  the second connection electrode directly contacts the second ends of the light emitting elements and the second electrode.

11. The display device of claim 1, wherein
  the first via layer and the second via layer each comprise an organic insulating material, and
  the second via layer comprises a different organic insulating material from the organic insulating material of the first via layer.

12. The display device of claim 11, wherein
  the first via layer comprises polyimide, and
  the second via layer comprises a siloxane-based organic insulating material.

13. A display device comprising:
  a first via layer disposed on a substrate and comprising trench parts recessed from an upper surface of the first via layer;
  a first electrode and a second electrode that are disposed on the first via layer and spaced apart from each other;
  a second via layer disposed on the first via layer and comprising:
    a base part;
    first openings formed in the base part that overlap the trench parts;
    a second opening partially exposing the second electrode; and bank parts protruding from an upper surface of the base part and spaced apart from each other;

light emitting elements disposed in the first openings of the second via layer;

sub electrodes disposed on the bank parts of the second via layer; and a third electrode disposed on the second via layer and the sub electrodes.

14. The display device of claim 13, wherein the first openings are formed between the bank parts and overlap the trench parts in a thickness direction.

15. The display device of claim 14, wherein a diameter of each of the first openings is reduced from an upper surface of the second via layer toward a bottom surface of the second via layer, and a maximum diameter of each of the first openings is smaller than a maximum diameter of the second opening.

16. The display device of claim 15, wherein a part of inner walls of each of the first openings directly contacts a part of an outer surface of a light emitting element, and the second via layer surrounds a part of each of the light emitting elements.

17. The display device of claim 15, wherein the maximum diameter of each of the first openings is smaller than a gap between the bank parts.

18. The display device of claim 13, wherein each of the light emitting elements includes:

a first end electrically connected to the first electrode; and a second end electrically connected to the third electrode, each of the light emitting elements is disposed such that an extending direction of the light emitting elements is not parallel to an upper surface of the substrate, and an angle formed by the extending direction of the light emitting elements and a direction perpendicular to the upper surface of the substrate is in a range of about 0 degrees to about 60 degrees.

19. The display device of claim 13, wherein a thickness of the base part of the second via layer is smaller than a thickness of a part of the second via layer on which the bank parts are disposed, and the thickness of the part on which the bank parts are disposed is greater than a length of each light emitting element in the extending direction.

20. The display device of claim 13, wherein the first via layer comprises polyimide, and the second via layer comprises a siloxane-based organic insulating material.

* * * * *